United States Patent
Ueda et al.

(10) Patent No.: US 7,772,709 B2
(45) Date of Patent: Aug. 10, 2010

(54) RESIN SEALED SEMICONDUCTOR DEVICE AND MANUFACTURING METHOD THEREFOR

(75) Inventors: Tetsuya Ueda, Tokyo (JP); Takaaki Shirasawa, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 27 days.

(21) Appl. No.: 12/196,590

(22) Filed: Aug. 22, 2008

(65) Prior Publication Data

US 2009/0302444 A1 Dec. 10, 2009

(30) Foreign Application Priority Data

Jun. 5, 2008 (JP) .............................. 2008-148040

(51) Int. Cl.
*H01L 23/28* (2006.01)
*H01L 21/48* (2006.01)

(52) U.S. Cl. ........................................ 257/787; 438/127
(58) Field of Classification Search ........................ None
See application file for complete search history.

(56) References Cited

U.S. PATENT DOCUMENTS

| 5,585,672 | A | * | 12/1996 | Koike et al. ............ 257/707 |
| 5,793,106 | A | * | 8/1998 | Yasukawa et al. ........... 257/712 |
| 6,424,026 | B1 | * | 7/2002 | Mangtani .................... 257/675 |
| 6,642,576 | B1 | | 11/2003 | Shirasawa et al. |
| 7,045,907 | B2 | * | 5/2006 | Shinohara .................... 257/796 |
| 7,291,869 | B2 | * | 11/2007 | Otremba ..................... 257/107 |
| 7,405,107 | B2 | * | 7/2008 | Nakazawa et al. .......... 438/124 |
| 2004/0179341 | A1 | * | 9/2004 | Kimoto et al. .............. 361/704 |

FOREIGN PATENT DOCUMENTS

| JP | 2002-26251 | 1/2002 |
| JP | 2004-47850 | 2/2004 |
| JP | 2004-193476 | 7/2004 |
| JP | 2005-64115 | 3/2005 |
| JP | 2005-64116 | 3/2005 |
| JP | 2005-303018 | 10/2005 |
| JP | 2005-333008 | 12/2005 |
| JP | 2006-49542 | 2/2006 |
| JP | 2006-120970 | 5/2006 |
| JP | 2006-134990 | 5/2006 |
| JP | 3879688 | 11/2006 |
| JP | 2007-35670 | 2/2007 |

* cited by examiner

*Primary Examiner*—Scott B Geyer
(74) *Attorney, Agent, or Firm*—Oblon, Spivak, McClelland, Maier & Neustadt, L.L.P.

(57) ABSTRACT

A resin sealed semiconductor device includes a first semiconductor switching device having a first emitter terminal and a first collector terminal bonded to its top and bottom surfaces respectively, a second semiconductor switching device having a second emitter terminal and a second collector terminal bonded to its top and bottom surfaces respectively, a first heat sink directly or indirectly bonded to the first collector terminal, a second heat sink directly or indirectly bonded to the second collector terminal, and a molding resin integrally covering the first and second semiconductor switching devices. The first and second heat sinks are exposed from the molding resin. The first emitter terminal faces and is spaced apart from the second emitter terminal.

12 Claims, 13 Drawing Sheets

RESIN SEALED SEMICONDUCTOR DEVICE AND MANUFACTURING METHOD THEREFOR

BACKGROUND OF THE INVENTION

1. Field of the Invention

The present invention relates to a resin sealed semiconductor device (or resin encapsulated semiconductor device) in which a plurality of semiconductor switching devices are stacked together and integrally sealed using a resin to reduce the footprint of the device, and also relates to a method for manufacturing such a resin sealed semiconductor device.

2. Background Art

IGBTs (Insulated Gate Bipolar Transistors) and power MOSFETs are semiconductor switching devices widely used for power conversion and motor control. There will now be described, with reference to FIG. 25, a three-phase AC inverter circuit using IGBTs which is an example of a circuit device employing semiconductor switching devices.

As shown in FIG. 25, this three-phase AC inverter circuit, 301, includes three inverter legs: a U-phase leg 302, a V-phase leg 304, and a W-phase leg 306. Each of the U-phase, V-phase, and W-phase legs 302, 304, and 306 is made up of an upper arm 310 and a lower arm 312. The upper arm 310 includes an IGBT 314 and a freewheel diode 316 connected in parallel to the IGBT 314, while the lower arm 312 includes an IGBT 318 and a freewheel diode 320 connected in parallel to the IGBT 318. The legs 302, 304, and 306 are connected to the same high voltage DC power supply and switched by their respective control signals sent from control circuitry so as to supply AC power components to a load 322.

It should be noted that it is common that such a circuit device containing a plurality of IGBTs (or semiconductor switching devices) is sealed, or encapsulated, with a resin. FIG. 26 shows an exemplary configuration of the U-phase leg 302 of the three-phase AC inverter circuit 301. Referring to FIG. 26, a first conductor electrode 334 and a second conductor electrode 332 are disposed on an insulating substrate 335.

The IGBT 314 and the freewheel diode 316 in the upper arm described above are disposed on the first conductor electrode 334 such that the collector of the IGBT 314 and the cathode of the freewheel diode 316 are in contact with the first conductor electrode 334. The IGBT 318 and the freewheel diode 320 in the lower arm described above, on the other hand, are disposed on the second conductor electrode 332 such that the collector of the IGBT 318 and the cathode of the freewheel diode 20 are in contact with the second conductor electrode 332. These components disposed on the first and second conductor electrodes 334 and 332 are interconnected by wires 308 thereby implementing the U-phase leg 302 shown in FIG. 25.

It should be noted that in FIG. 26 the IGBT 314 receives a control signal from a control terminal 338, and the IGBT 318 receives a control signal from a control terminal 340.

It is a common practice that an insulating substrate with devices mounted thereon is sealed using a resin. A general resin sealing process will be briefly described with reference to FIGS. 27 to 32. First, for example, semiconductor device assemblies (or inserts) 360 to be sealed with a resin are placed within the cavity, 357, formed by an upper die 350 and a lower die 352, as shown in FIG. 27. It should be noted that resin tablets 356 and a plunger 354 are set in place in a portion of the lower die 352 to supply a molding resin to the cavity.

Next, the upper and lower dies 350 and 352 are clamped together, as shown in FIG. 28. At that time, the molding resin (or resin tablets) to be delivered into the cavity is heated by the (heated) upper and lower dies, resulting in a reduction in the viscosity of the resin. The plunger 354 is then moved toward the inside of the cavity, thereby injecting the molding resin into the cavity (see FIG. 29). After that the temperatures of the upper and lower dies 350 and 352 are lowered to solidify the molding resin, 358, within the cavity (see FIG. 30). Lastly, the solidified molding resin (containing the semiconductor device assemblies) is retrieved from between the upper and lower dies 350 and 352, as shown in FIG. 31, and split in the desired manner, as shown in FIG. 32. This completes the resin sealing process.

This resin sealing method is useful when each semiconductor device assembly (or insert) to be sealed is manufactured to a thickness within a predetermined range. However, the method cannot be used to sufficiently improve the heat dissipation characteristics of the device, nor does it allow the footprint of the device to be reduced. Accordingly, there has been a need for an improved resin sealing technique.

The footprint of a resin sealed semiconductor device may be reduced by stacking its semiconductor elements (e.g., IGBTs) together in the thickness direction of the device. That is, in the case of the three-phase AC inverter described above, the IGBT of the upper arm of one of the U-phase, V-phase, and W-phase legs may be stacked on the IGBT of its lower arm, and this structure may be sealed with a resin. (See, e.g., Japanese Laid-Open Patent Publication Nos. 2006-049542, 2006-134990, 2004-193476, 2002-026251, 2004-047850, 2005-064116, 2005-064115, 2005-333008, and 2005-303018.) This allows the footprint of the leg to be approximately halved, as compared to when the semiconductor elements (IGBTs) are disposed side by side on the flat surface of the substrate, as shown in FIG. 26.

As described above, the density of components in the resin sealed semiconductor device can be increased by stacking each pair of IGBTs together, as compared to the case where a plurality of semiconductor elements (IGBTs) are disposed side by side on the flat surface of the substrate. In such a case, however, it is necessary to improve the heat dissipation characteristics of the resin sealed components (IGBTs, etc.), since power semiconductor devices need have good heat dissipation characteristics to maintain their performance. To achieve this, a semiconductor device assembly, or structure, 401 as shown in FIG. 34 may be formed and sealed with a resin. Specifically, the semiconductor device assembly 401 may be placed within a molding die and sealed with a resin. This assembly 401 includes an IGBT 410 and an IGBT 408 stacked on the IGBT 410 and also includes a diode 424 and a diode 426 stacked on the diode 424.

A heat spreader 422 of a metal is bonded to the emitter of the IGBT 408, for example, by solder 416 (see FIG. 34). (It should be noted that the emitter and gate of the IGBT 408 are formed on the top side of the IGBT.) The heat spreader 422 is also bonded to the anode of the diode 426. A copper foil 434 (a heat sink) is bonded through an insulating layer 430 to the surface of the heat spreader 422 opposite that to which the emitter of the IGBT 408 is bonded. The surface of the copper foil 434 opposite that in contact with the insulating layer 430 is exposed to the outside environment, even after the resin molding process.

As for the IGBT 410 disposed beneath the IGBT 408, a heat spreader 420 of a metal is bonded to the bottom surface of the IGBT 410. (It should be noted that the collector of the IGBT 410 is formed in this surface.) The heat spreader 420 is also bonded to the cathode of the diode 424. A copper foil 436 (a heat sink) is bonded through an insulating layer 432 to the surface of the heat spreader 420 opposite that to which the collector of the IGBT 410 is bonded. The surface of the copper foil 436 opposite that in contact with the insulating layer 432 is exposed to the outside environment, even after the resin molding process.

This semiconductor device assembly 401 (configured as described above) is sealed with a molding resin using a molding die made up of a lower die 402, an intermediate die 404, and an upper die 406 as shown in FIG. 33. The intermediate die 404 is placed on and in contact with an upper surface of the lower die 402, and the upper die 406 is placed on and in contact with the upper surface of the intermediate die 404 and another upper surface of the lower die 402 (see FIG. 33). These molding die members are clamped together (after the assembly 401 is placed within the cavity, 400, of the molding die). A resin sealing method using the lower, intermediate, and upper dies 402, 404, and 406 will now be described by comparing it with the conventional resin sealing method described above with reference to FIGS. 27 to 32.

It should be noted that since it is necessary to expose to the atmosphere the surfaces of the copper foils 434 and 436 of the semiconductor device assembly 401 opposite those in contact with the insulating layers 430 and 432, respectively, these surfaces must be pressed against inner walls of the cavity 400 when the assembly is placed in position within the cavity 400 and a molding resin is injected into the cavity. This prevents the molding resin from reaching these surfaces of the copper foils 434 and 436 when the semiconductor device assembly 401 is molded, since they are in close contact with inner walls of the cavity 400. In this way, portions of the copper foils 434 and 436 (i.e., the above surfaces in contact with inner walls of the cavity) can be exposed to the outside environment.

As a result, in operation of this sealed assembly 401, the heat generated therein is dissipated from the copper foils 434 and 436, as well as from the emitter terminal, 440, of the IGBT 408, the collector terminal, 438, of the IGBT 410, and the main electrode 428 shown in FIG. 34 (the emitter terminal 440 being connected to the heat spreader 422 and extending from the molding resin). Thus, this resin sealing method allows the manufacture of resin sealed semiconductor devices having good heat dissipation characteristics.

However, the above method is disadvantageous in that it requires that the thickness, B, of the semiconductor device assembly 401 be exactly equal to the depth of the cavity 400 (denoted by A in FIG. 33) of the molding die made up of the lower, intermediate, and upper dies 402, 404, and 406. With this arrangement, a molding resin can be injected into the cavity such that the resin does not reach portions (or surfaces) of the copper foils 434 and 436, thereby allowing these portions to be exposed to the outside environment even after this molding process. Furthermore, excessive force is not applied to the semiconductor device assembly 401 during the process (if the above requirement is met). However, the thickness B of the semiconductor device assembly 401 is apt to vary a certain amount when manufactured.

Therefore, it happens that the thickness B of the semiconductor device assembly 401 is smaller than the cavity depth. In such a case, the copper foil 434 is spaced from the facing inner wall of the upper die 406 by a gap 450, and the copper foil 436 is spaced from the facing inner wall of the lower die 402 by a gap 452, as shown in FIG. 35, even after the lower, intermediate, and upper dies 402, 404, and 406 are clamped together. If the semiconductor device assembly 401 is sealed with a molding resin 454 in this state, the resin flows to cover those surfaces of the copper foils 434 and 436 that must be exposed to the outside environment, due to the gaps 450 and 452, as shown in FIG. 36, making it difficult to improve the heat dissipation characteristics of the device.

It also happens that the thickness B of the semiconductor device assembly 401 is greater than the cavity depth A. In such a case, the lower, intermediate, and upper dies 402, 404, and 406 cannot be clamped closely together, as shown in FIG. 37. Specifically, for example, a gap 460 may be formed between an upper surface of the lower die 402 and the facing lower surface of the upper die 406 (see FIG. 37). Eliminating this gap requires clamping the lower, intermediate, and upper dies 402, 404, and 406 together with a very strong force. Such forcible clamping, however, may result in destruction of components (as indicated by reference numerals 462, 464, 466, and 468 in FIG. 38).

Thus there are known resin sealed semiconductor devices in which semiconductor switching devices such as IGBTs are stacked together in order to reduce the footprint. In the manufacture of such resin sealed semiconductor devices, each semiconductor device assembly including stacked semiconductor switching devices may be sealed with a molding resin using a molding die while a portion(s) of the assembly is maintained in close contact with inner walls of the molding die, which leads to improved heat dissipation characteristics of the assembly (or resin sealed semiconductor device). However, this sealing method is disadvantageous in that, due to the variation in the thickness of the semiconductor device assembly when manufactured, the molding resin may flow to entirely cover the semiconductor device assembly during the molding process, or the assembly may be broken or damaged when the die members are clamped together.

SUMMARY OF THE INVENTION

The present invention has been devised to solve the above problems. It is, therefore, an object of the present invention to provide a resin sealed semiconductor device having a reduced footprint and improved heat dissipation characteristics and also provide a method for manufacturing such a resin sealed semiconductor device.

According to one aspect of the present invention, a resin sealed semiconductor device includes a first semiconductor switching device having an emitter in a top surface thereof and a collector in a bottom surface thereof, a first emitter terminal bonded to the emitter of the first semiconductor switching device, a first collector terminal bonded at a first surface thereof to the collector of the first semiconductor switching device, a second semiconductor switching device having an emitter in a top surface thereof and a collector in a bottom surface thereof, a second emitter terminal bonded to the emitter of the second semiconductor switching device, a second collector terminal bonded at a first surface thereof to the collector of the second semiconductor switching device, a first heat sink directly or indirectly bonded at a first surface thereof to a second surface of the first collector terminal, the second surface of the first collector terminal being opposite the first surface of the first collector terminal, a second heat sink directly or indirectly bonded at a first surface thereof to a second surface of the second collector terminal, the second surface of the second collector terminal being opposite the first surface of the second collector terminal, and a molding resin integrally covering the first and second semiconductor switching devices. A second surface of the first heat sink is exposed from the molding resin, the second surface of the first heat sink being opposite the first surface of the first heat sink. A second surface of the second heat sink is exposed from the molding resin, the second surface of the second heat sink being opposite the first surface of the second heat sink. The emitter of the first semiconductor switching device faces the emitter of the second semiconductor switching device. The first emitter terminal is spaced apart from the second emitter terminal.

In another aspect of the present invention, a resin sealed semiconductor device includes a first semiconductor switching device having an emitter in a top surface thereof and a collector in a bottom surface thereof, a second semiconductor switching device having an emitter in a top surface thereof and a collector in a bottom surface thereof, a main electrode output terminal sandwiched between the top surface of the first semiconductor switching device and the bottom surface of the second semiconductor switching device, a first collector terminal bonded at a first surface thereof to the collector of the first semiconductor switching device, a second emitter terminal bonded at a first surface thereof to the emitter of the second semiconductor switching device, a first high heat dissipation insulator of an organic composition directly or indirectly bonded at a first surface thereof to a second surface of the first collector terminal, the second surface of the first collector terminal being opposite the first surface of the first collector terminal, a second high heat dissipation insulator of an organic composition directly or indirectly bonded at a first surface thereof to a second surface of the second emitter terminal, the second surface of the second emitter terminal being opposite the first surface of the second emitter terminal, a first heat sink bonded at a first surface thereof to a second surface of the first high heat dissipation insulator, the second surface of the first high heat dissipation insulator being opposite the first surface of the first high heat dissipation insulator, a second heat sink bonded at a first surface thereof to a second surface of the second high heat dissipation insulator, the second surface of the second high heat dissipation insulator being opposite the first surface of the second high heat dissipation insulator, and a molding resin integrally covering the first and second semiconductor switching devices. A second surface of the first heat sink is exposed from the molding resin, the second surface of the first heat sink being opposite the first surface of the first heat sink. A second surface of the second heat sink is exposed from the molding resin, the second surface of the second heat sink being opposite the first surface of the second heat sink. The first and second high heat dissipation insulators have a glass transition temperature lower than the temperature at which the molding resin softens.

In another aspect of the present invention, a method for manufacturing a resin sealed semiconductor device, includes the steps of bonding a first emitter terminal to an emitter formed in a top surface of a first semiconductor switching device, bonding a first surface of a first collector terminal to a collector formed in a bottom surface of the first semiconductor switching device, directly or indirectly bonding a first surface of a first heat sink to a second surface of the first collector terminal, the second surface of the first collector terminal being opposite the first surface of the first collector terminal, bonding a second emitter terminal to an emitter formed in a top surface of a second semiconductor switching device, bonding a first surface of a second collector terminal to a collector formed in a bottom surface of the second semiconductor switching device, directly or indirectly bonding a first surface of a second heat sink to a second surface of the second collector terminal, the second surface of the second collector terminal being opposite the first surface of the second collector terminal, placing the first and second semiconductor switching devices, the first and second emitter terminals, the first and second collector terminals, and the first and second heat sinks together in position within a cavity formed by an upper die and a lower die, and injecting a molding resin into the cavity to integrally cover the first and second semiconductor switching devices. The placing step and the injecting step are performed such that a second surface of the first heat sink is in contact with an inner bottom surface of the lower die, the second surface of the first heat sink being opposite the first surface of the first heat sink, a second surface of the second heat sink is in contact with an inner top surface of the upper die, the second surface of the second heat sink being opposite the first surface of the second heat sink, the emitter of the first semiconductor switching device faces the emitter of the second semiconductor switching device, and the first emitter terminal is spaced apart from the second emitter terminal.

In another aspect of the present invention, a method for manufacturing a resin sealed semiconductor device includes the steps of bonding a first surface of a first collector terminal to a collector of a first semiconductor switching device, the first semiconductor switching device having an emitter in a top surface thereof and the collector in a bottom surface thereof, directly or indirectly bonding a first surface of a first high heat dissipation insulator of an organic composition to a second surface of the first collector terminal, the second surface of the first collector terminal being opposite the first surface of the first collector terminal, bonding a first surface of a first heat sink to a second surface of the first high heat dissipation insulator, the second surface of the first high heat dissipation insulator being opposite the first surface of the first high heat dissipation insulator, bonding a first surface of a second emitter terminal to an emitter of a second semiconductor switching device, the second semiconductor switching device having the emitter in a top surface thereof and a collector in a bottom surface thereof, directly or indirectly bonding a first surface of a second high heat dissipation insulator of an organic composition to a second surface of the second emitter terminal, the second surface of the second emitter terminal being opposite the first surface of the second emitter terminal, bonding a first surface of a second heat sink to a second surface of the second high heat dissipation insulator, the second surface of the second high heat dissipation insulator being opposite the first surface of the second high heat dissipation insulator, bonding and sandwiching a main electrode output terminal between the top surface of the first semiconductor switching device and the bottom surface of the second semiconductor switching device, placing the first and second semiconductor switching devices, the first collector terminal, the second emitter terminal, the first and second high heat dissipation insulators, the first and second heat sinks, and the main electrode output terminal together in position within a cavity formed by an upper die and a lower die, and injecting a molding resin into the cavity to integrally cover the first and second semiconductor switching devices. The first and second high heat dissipation insulators have a glass transition temperature lower than the temperature at which the molding resin softens. The placing step and the injecting step are performed such that a second surface of the first heat sink is in contact with an inner bottom surface of the lower die, the second surface of the first heat sink being opposite the first surface of the first heat sink, and a second surface of the second heat sink is in contact with an inner top surface of the upper die, the second surface of the second heat sink being opposite the first surface of the second heat sink.

DETAILED DESCRIPTION OF THE PREFERRED EMBODIMENTS

First Embodiment

Figure 1:
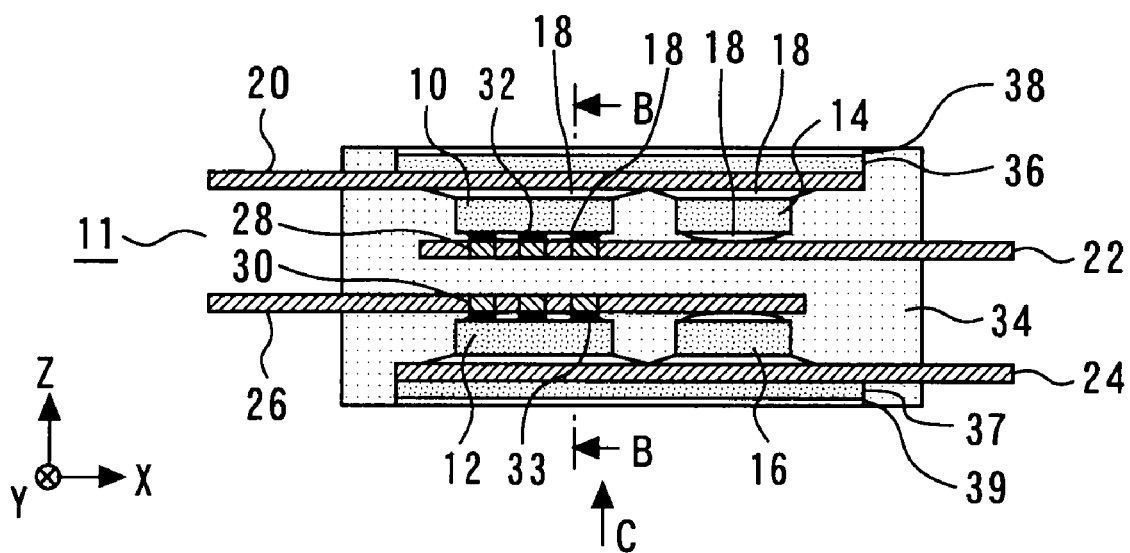
FIG. 1 is a cross-sectional view of the resin sealed semiconductor device of first embodiment.

A first embodiment of the present invention relates to a resin sealed semiconductor device having a reduced size and improved heat dissipation characteristics, and also relates to a method for manufacturing such a resin sealed semiconductor device. FIG. 1 is a cross-sectional view of the resin sealed semiconductor device, 11, of the present embodiment. The resin sealed semiconductor device 11 includes a first IGBT 10 having a gate and an emitter formed in its top surface (the lower surface as viewed in FIG. 1) and a collector formed in its bottom surface (the upper surface as viewed in FIG. 1). A first control terminal 28 is connected to the gate of the first IGBT 10 through a first internal wire 32, and a first emitter terminal 22 is connected to the emitter of the first IGBT 10 by solder 18. Further, a first collector terminal 20 is connected to the collector of the first IGBT 10 by solder 18.

The resin sealed semiconductor device 11 further includes a first diode 14 having a cathode formed in its top surface (the upper surface as viewed in FIG. 1) and an anode formed in its bottom surface (the lower surface as viewed in FIG. 1). The cathode of the first diode 14 is connected to the first collector terminal 20 by solder 18, and the anode of the first diode 14 is connected to the first emitter terminal 22 by solder 18. That is, the first collector terminal 20 is connected at a predetermined surface thereof to the collector of the first IGBT 10 and the cathode of the first diode 14; and the first emitter terminal 22 is connected at a predetermined surface thereof to the emitter of the first IGBT 10 and the anode of the first diode 14.

A first insulating layer 36 is disposed on the surface of the first collector terminal 20 opposite that to which the collector of the first IGBT 10 and the cathode of the first diode 14 are connected. (This surface of the first collector terminal 20 is hereinafter referred to as the "first collector terminal heat dissipation surface.") Thus, the first insulating layer 36 is formed on and in contact with the first collector terminal heat dissipation surface so as to insulate the first collector terminal 20. A first heat sink 38 is disposed on the surface of the first insulating layer 36 opposite that in contact with the first collector terminal heat dissipation surface. The first heat sink 38 is of plate-like shape, and the surface thereof opposite that in contact with the first insulating layer 36 is exposed from the molding resin, 34. The first heat sink 38 is made of a metal and enhances the heat dissipation from inside the molding resin 34, especially from the first collector terminal 20. It should be noted that the first collector terminal heat dissipation surface described above is thermally connected to the first heat sink 38 through the first insulating layer 36 to dissipate heat. However, other surfaces of the first collector terminal 20 may also serve to dissipate heat from the terminal.

For convenience of explanation, the term "upper structure," or "high side," may be hereinafter used to refer to the assembly made up of the first IGBT 10, the first diode 14, the first collector terminal 20, the first emitter terminal 22, the first internal wire 32, the first control terminal 28, the first insulating layer 36, and the first heat sink 38.

The resin sealed semiconductor device 11 also includes a second IGBT 12 having a gate and an emitter formed in its top surface (the upper surface as viewed in FIG. 1) and a collector formed in its bottom surface (the lower surface as viewed in FIG. 1). A second control terminal 30 is connected to the gate of the second IGBT 12 through a second internal wire 33, and a second emitter terminal 26 is connected to the emitter of the second IGBT 12 by solder 18. Further, a second collector terminal 24 is connected to the collector of the second IGBT 12 by solder 18.

The resin sealed semiconductor device 11 of the present embodiment further includes a second diode 16 having a cathode formed in its top surface (the lower surface as viewed in FIG. 1) and an anode formed in its bottom surface (the upper surface as viewed in FIG. 1). The cathode of the second diode 16 is connected to the second collector terminal 24 by solder 18.

Further, the anode of the second diode 16 is connected to the second emitter terminal 26 by solder 18. That is, the second collector terminal 24 is connected at a predetermined surface thereof to the collector of the second IGBT 12 and the cathode of the second diode 16; and the second emitter terminal 26 is connected at a predetermined surface thereof to the emitter of the second IGBT 12 and the anode of the second diode 16.

A second insulating layer 37 is disposed on the surface of the second collector terminal 24 opposite that to which the collector of the second IGBT 12 and the cathode of the second diode 16 are connected. (This surface of the second collector terminal 24 is hereinafter referred to as the "second collector terminal heat dissipation surface.") Thus, the second insulating layer 37 is formed on and in contact with the second collector terminal heat dissipation surface so as to insulate the second collector terminal 24. A second heat sink 39 is disposed on the surface of the second insulating layer 37 opposite that in contact with the second collector terminal heat dissipation surface. The second heat sink 39 is of plate-like shape, and the surface thereof opposite that in contact with the second insulating layer 37 is exposed from the molding resin 34. The second heat sink 39 is made of a metal and enhances the heat dissipation from inside the molding resin 34, especially from the second collector terminal 24. Like the first collector terminal heat dissipation surface, the second collector terminal heat dissipation surface is thermally connected to the second heat sink 39 through the second insulating layer 37 to dissipate heat. However, other surfaces of the second collector terminal 24 may also serve to dissipate heat from the terminal.

For convenience of explanation, the term "lower structure," or "low side," may be hereinafter used to refer to the assembly made up of the second IGBT 12, the second diode 16, the second collector terminal 24, the second emitter terminal 26, the second internal wire 33, the second control terminal 30, the second insulating layer 37, and the second heat sink 39. In the lower structure, as described above, solder (18) is used to connect components together in the same manner as in the upper structure.

In the resin sealed semiconductor device 11 of the present embodiment, the upper and lower structures described above are integrally covered by the molding resin 34. Further, according to the present example, the upper and lower structures are disposed such that the first emitter terminal 22 faces and is spaced from the second emitter terminal 26 by a gap of approximately 0.1 mm. It should be noted that this gap between the first and second emitter terminals 22 and 26 may be of any size greater than the sum of the tolerances of the thicknesses of the upper and lower structures. This gap is filled with the molding resin 34.

Although the molding resin 34 completely covers the first and second IGBTs 10 and 12 and the first and second diodes 14 and 16, it only partially covers the first and second collector terminals 20 and 24, the first and second emitter terminals 22 and 26, and the first and second control terminals 28 and 30; these terminals extend outwardly from the molding resin 34.

More specifically, as shown in FIG. 1, the first collector terminal 20 and the second emitter terminal 26 extend parallel to each other and in the same direction within and outwardly from the molding resin 34. Further, the first emitter terminal 22 and the second collector terminal 24 extend parallel to each other and in the same direction within and outwardly from the molding resin 34. It should be noted that the first emitter terminal 22 and the second collector terminal 24 extend from the molding resin 34 in a direction opposite the first collector terminal 20 and the second emitter terminal 26, as shown in FIG. 1.

Figure 25:
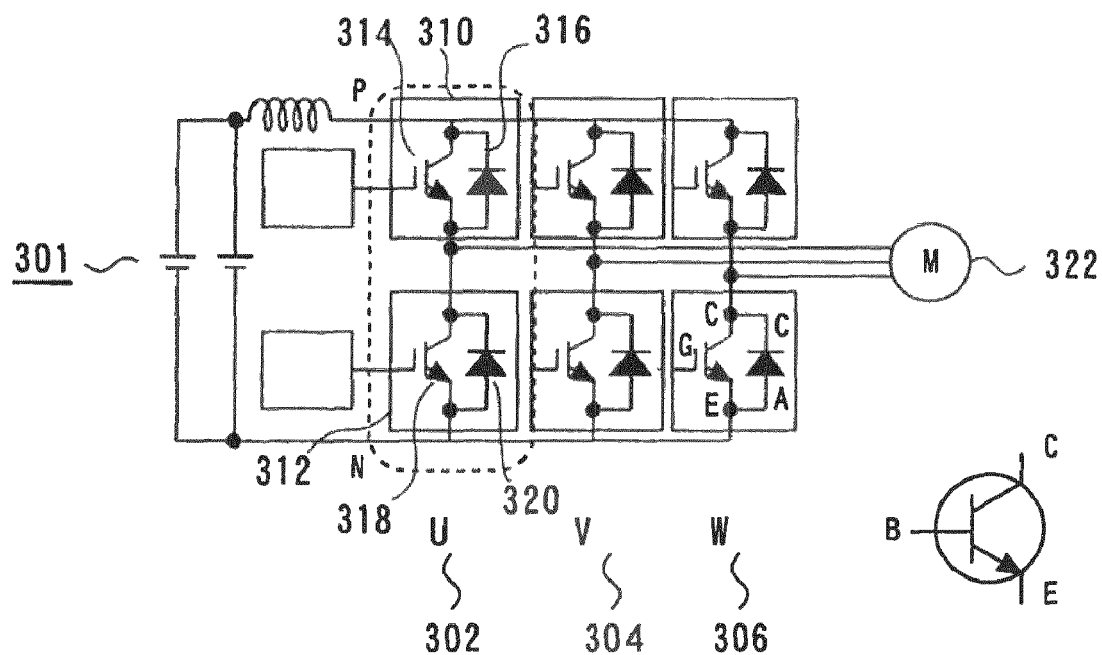
FIG. 25 shows three-phase AC inverter circuit.
Figure 26:
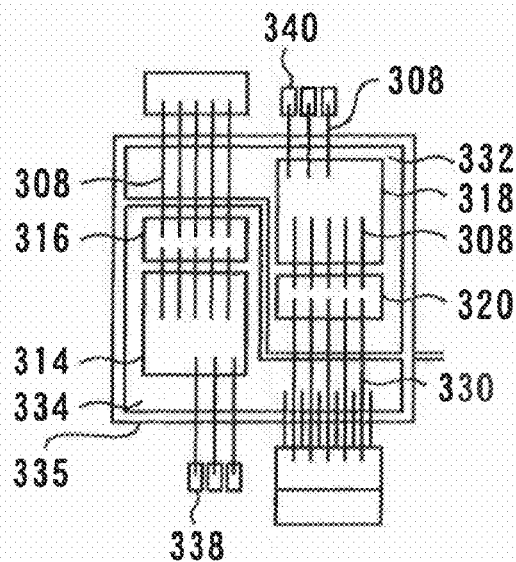
FIG. 26 shows exemplary configuration of the U-phase leg of the three-phase AC inverter circuit.
Figure 27:
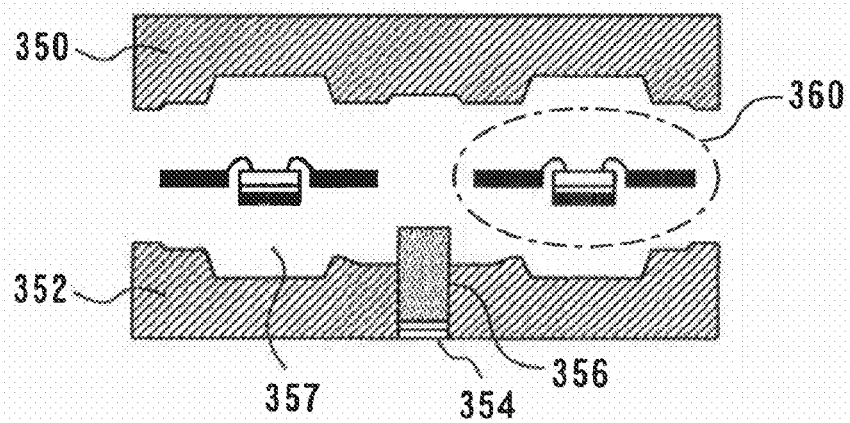
FIG. 27 shows semiconductor device assemblies placed within the cavity.
Figure 28:
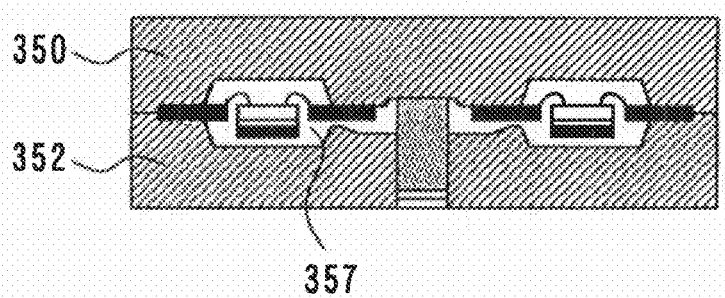
FIG. 28 shows the clamped upper and lower dies.
Figure 29:
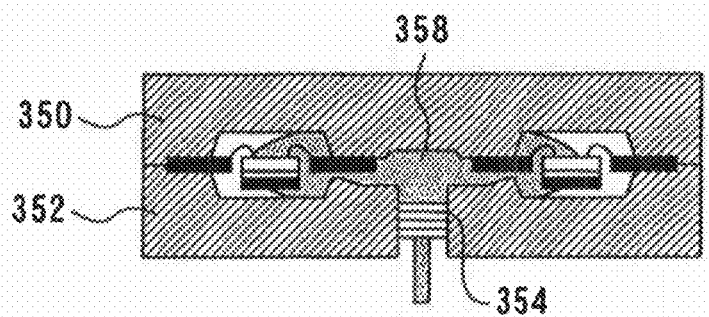
FIG. 29 shows the injection of molding resin into the cavity.
Figure 30:
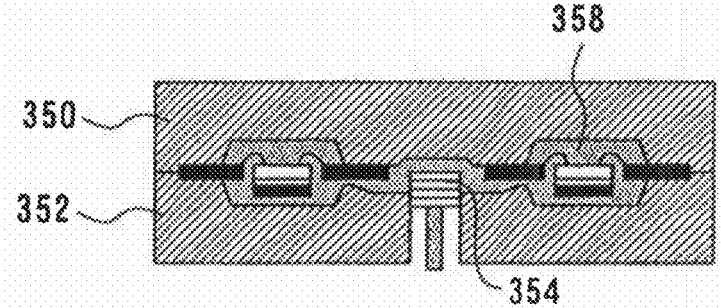
FIG. 30 shows the cooling step of the molding resin.
Figure 31:
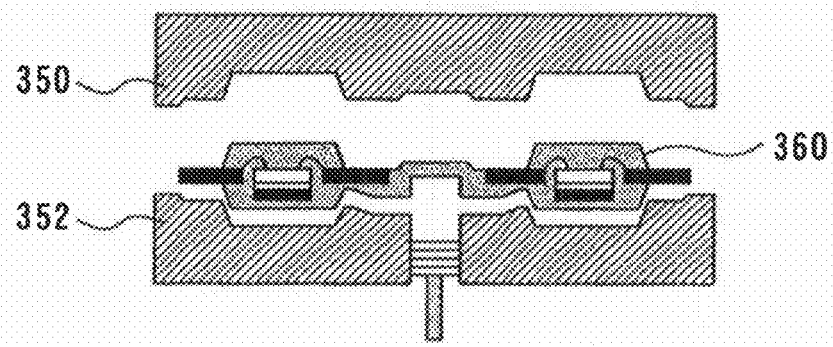
FIG. 31 shows the retrieved molding resin.
Figure 32:
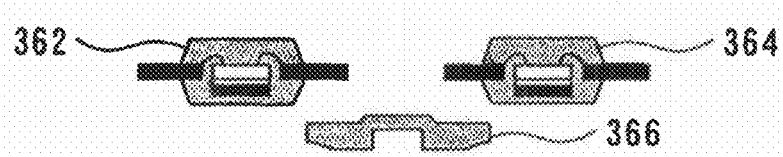
FIG. 32 shows the split device after molding.
Figure 33:
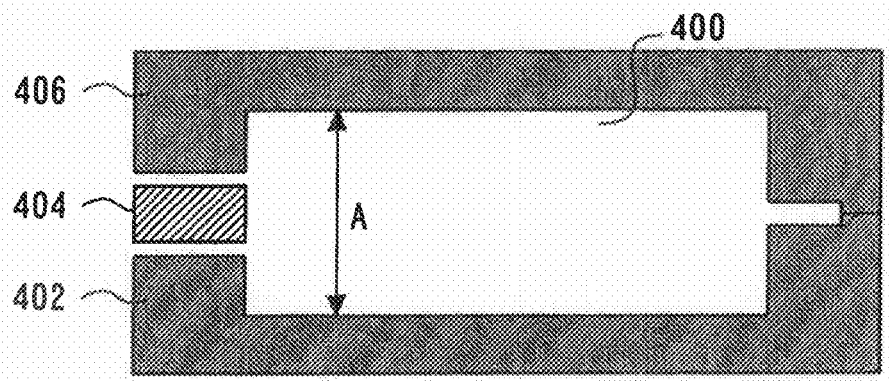
FIG. 33 shows the molding die made up of a lower die, an intermediate die, and an upper die.
Figure 34:
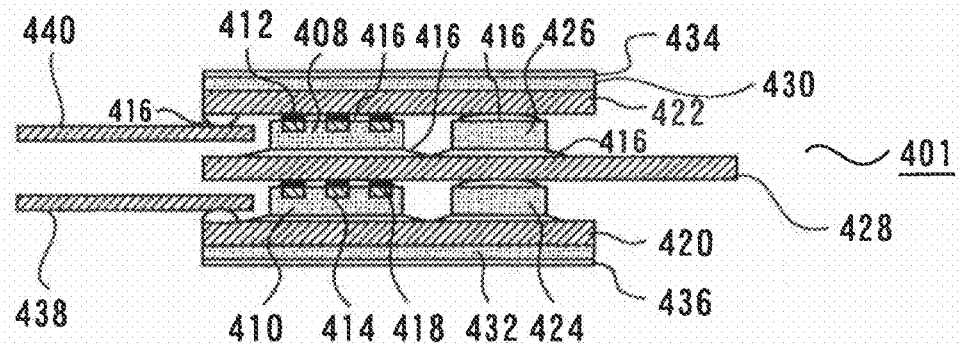
FIG. 34 shows the typical semiconductor device assemblies before molding.
Figure 35:
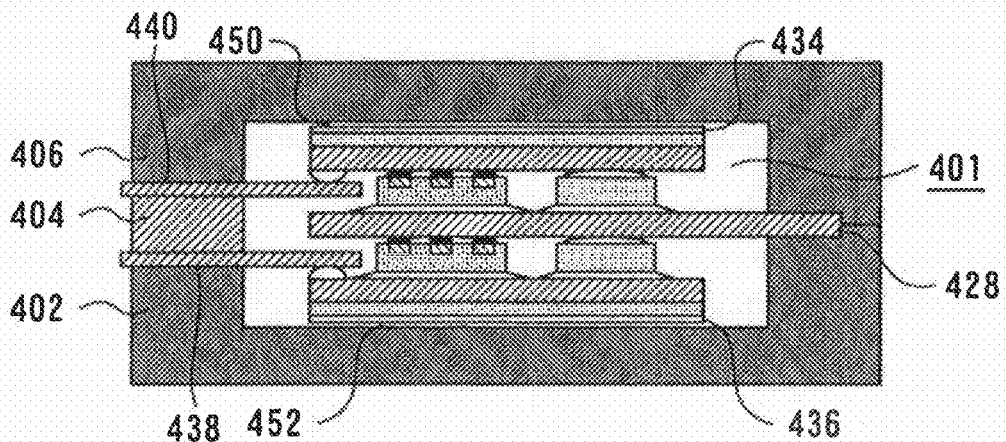
FIG. 35 shows the thickness of the semiconductor device assembly is smaller than the cavity depth.
Figure 36:
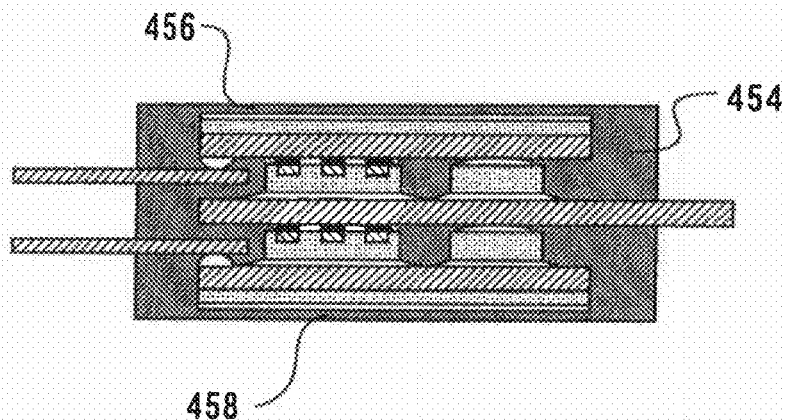
FIG. 36 shows the semiconductor device assembly even the heat sink is completely covered with resin.
Figure 37:
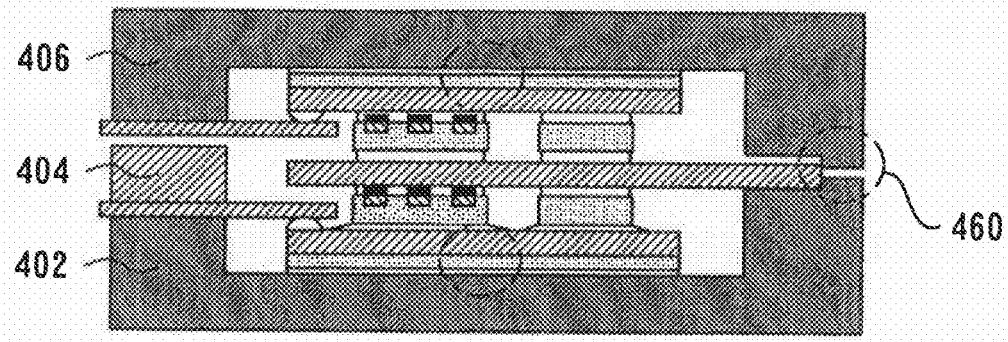
FIG. 37 shows the thickness of the semiconductor device assembly is greater than the cavity depth.
Figure 38:
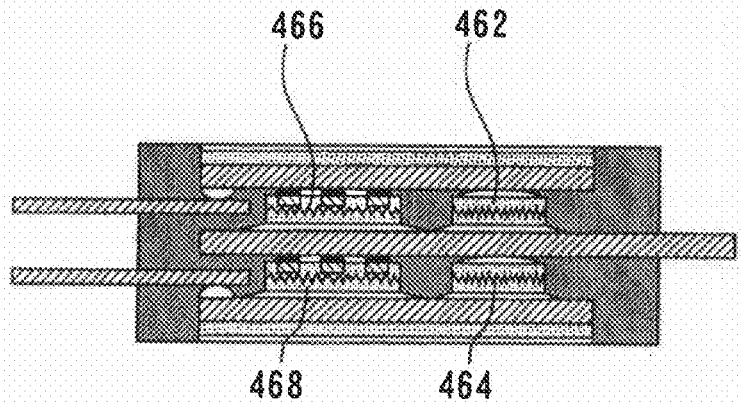
FIG. 38 shows the destruction of semiconductor device assembly due to molding die.

The resin sealed semiconductor device of the present embodiment configured as described above may be used as any one of the U-phase leg 302, the V-phase leg 304, and the W-phase leg 306 of the three-phase AC inverter described with reference to FIG. 25.

Figure 2:
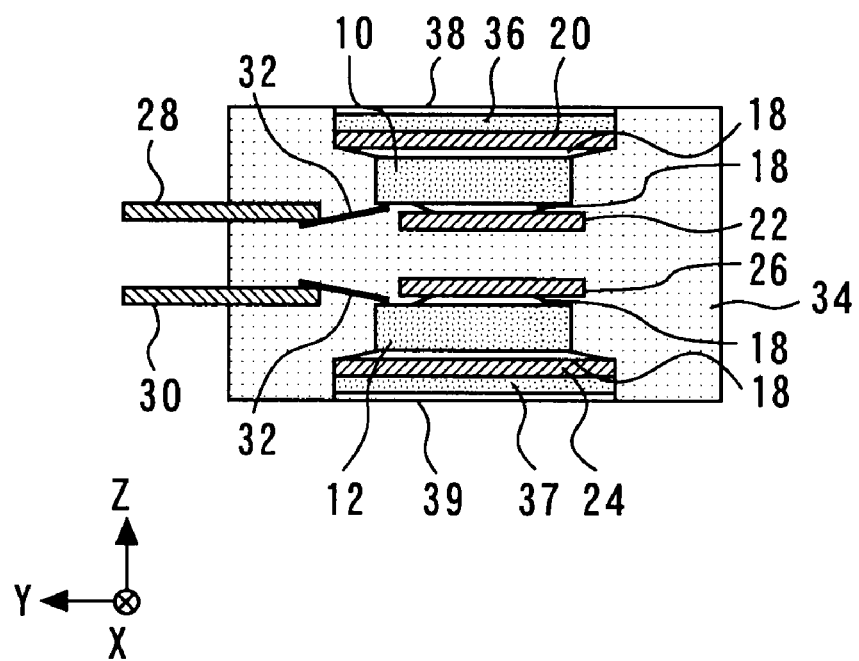
FIG. 2 is a cross-sectional view of the resin sealed semiconductor device of FIG. 1 as viewed in the direction of the arrows B.

FIG. 2 is a cross-sectional view of the resin sealed semiconductor device of FIG. 1 as viewed in the direction of the arrows B. As shown in FIG. 2, the gate of the first IGBT 10 is connected to the first control terminal 28 by the first internal wire 32, and the gate of the second IGBT 12 is connected to the second control terminal 30 by the second internal wire 33. Both the first and second control terminals 28 and 30 extend within and outwardly from the molding resin 34.

Figure 3:
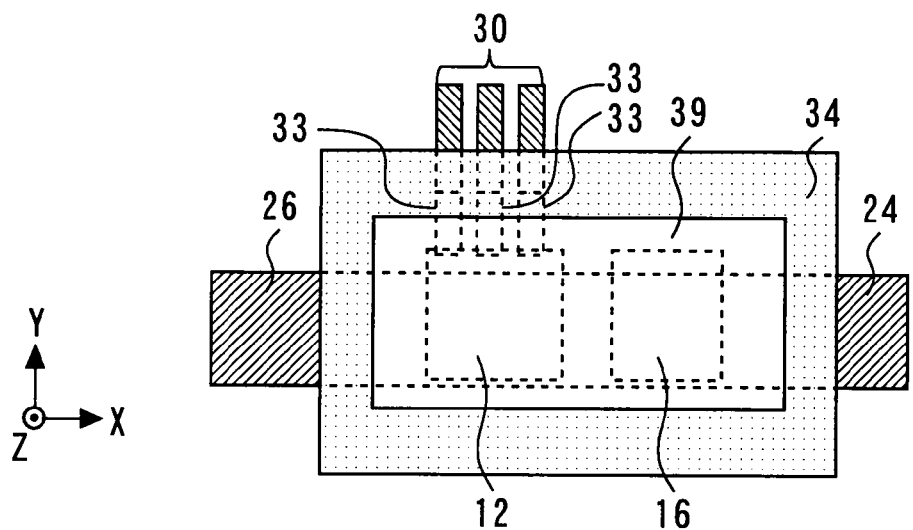
FIG. 3 is a bottom view of the resin sealed semiconductor device of the FIG. 1 as viewed in the direction of the arrow C.

FIG. 3 is a bottom view of the resin sealed semiconductor device 11 of the present embodiment as viewed in the direction of arrow C of FIG. 1. As shown, the second heat sink 39 overlaps a large area of the second collector terminal heat dissipation surface.

Figure 4:
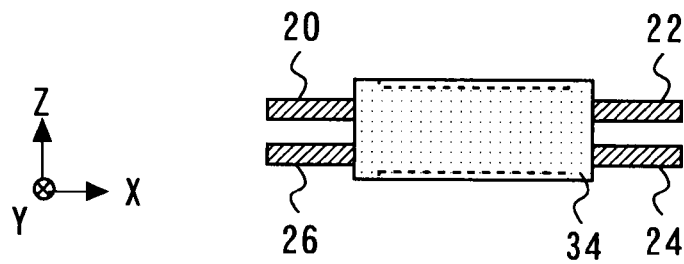
FIG. 4 is view of the resin sealed semiconductor device of FIG. 1 as viewed from different angle.
Figure 5:
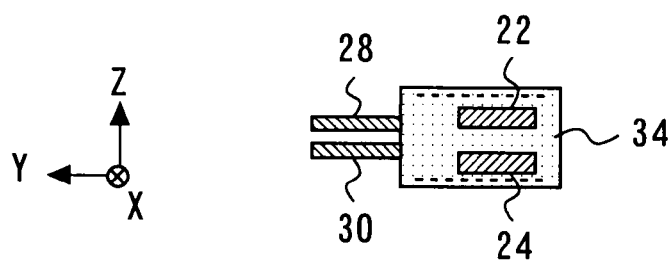
FIG. 5 is view of the resin sealed semiconductor device of FIG. 1 as viewed from different angle.
Figure 6:
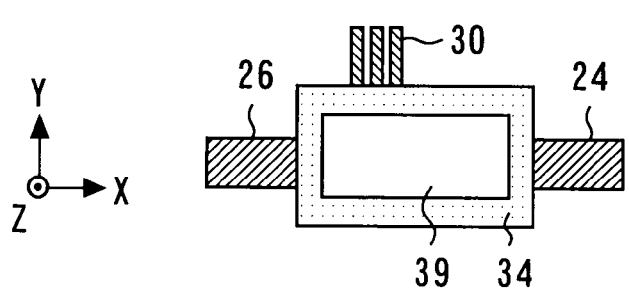
FIG. 6 is view of the resin sealed semiconductor device of FIG. 1 as viewed from different angle.

FIGS. 4, 5, and 6 are views of the resin sealed semiconductor device 11 of FIG. 1 as viewed from different angles. The components of the device retain the same reference numerals and will not be further described.

Figure 7:
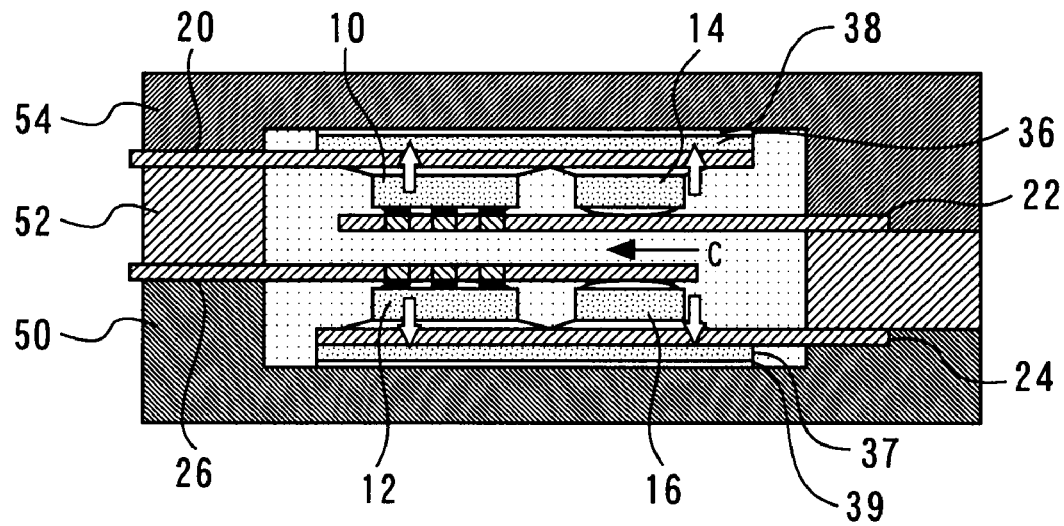
FIG. 7 is a diagram illustrating a method for manufacturing the resin sealed semiconductor device according to the first embodiment.

FIG. 7 is a diagram illustrating a method for manufacturing the resin sealed semiconductor device 11 according to the present embodiment. According to this method, the resin sealed semiconductor device 11 is sealed with a molding resin using a lower die 50, an intermediate die 52, and an upper die 54. Specifically, the upper and lower structures of the device are placed within the cavity formed by the inner walls of the lower die 50, the intermediate die 52, and the upper die 54, and then a molding resin is injected into the cavity to seal these structures.

The resin sealing process will now be described in more detail with reference to FIG. 7. First, the lower structure (assembled using solder, etc.) is placed on the lower die 50. At that time, the portions of the second emitter terminal 26 and the second collector terminal 24 that are to be protruded from the molding resin are placed on the respective upper surfaces of the lower die 50 (see FIG. 7).

Next, the intermediate die 52 is placed on these portions of the second emitter terminal 26 and the second collector terminal 24, so that they are sandwiched between the lower surfaces of the intermediate die 52 and the upper surfaces of the lower die 50 (see FIG. 7).

After that the upper structure (assembled using solder, etc.) is placed on the intermediate die 52. More specifically, the portions of the first collector terminal 20 and the first emitter terminal 22 that are to be protruded from the molding resin are placed on the respective upper surfaces of the intermediate die 52.

The upper die 54 is then placed on these portions of the first collector terminal 20 and the first emitter terminal 22, so that they are sandwiched between the lower surfaces of the upper die 54 and the upper surfaces of the intermediate die 52.

When the upper and lower structures are thus placed in position within the cavity formed by the lower, intermediate, and upper dies 50, 52, and 54, the first emitter terminal 22 faces and is spaced from the second emitter terminal 26 by a predetermined gap. It should be noted that this gap can be adjusted by changing the thickness of the intermediate die 52.

Next, the lower, intermediate, and upper dies 50, 52, and 54 are clamped together. Specifically, pressure is applied to the lower die 50 or upper die 54 or both to fix the upper and lower structures in position. According to the present embodiment, as a result of this clamping, the surface of the first heat sink 38 opposite that in contact with the first insulating layer 36 (this surface being hereinafter referred to as the "first heat dissipation surface") is in contact with an inner wall of the upper die 54. Further, the surface of the second heat sink 39 opposite that in contact with the second insulating layer 37 (this surface being hereinafter referred to as the "second heat dissipation surface") is in contact with an inner wall of the lower die 50.

In the present example, after the above clamping of the dies, the first emitter terminal 22 is spaced from the second emitter terminal 26 by a gap of 0.1 mm (indicated by C in FIG. 7). However, these terminals may be spaced from each other by a gap of any suitable size, as described above.

A molding resin is then injected into the cavity formed by the clamped dies to integrally seal the upper and lower structures together.

The resin sealed semiconductor device and the manufacturing method therefor described above have the following features. First, according to the present embodiment, when the upper and lower structures are sealed with a resin, the first emitter terminal 22 is spaced from the second emitter terminal 26 by a gap (indicated by C in FIG. 7), as described above with reference to FIG. 7. This gap C accommodates an increase in the sum of the thicknesses of the upper and lower structures and prevents the contact between the first and second emitter terminals 22 and 26, thereby preventing damage to the IGBTs, etc. This eliminates the need for accurate control of the thicknesses of the upper and lower structures before the resin sealing process, the need for a buffer layer to prevent excessive force from being applied to the upper and lower structures when the dies are clamped together, and the need for a complicated die structure. Thus, the resin sealed semiconductor device of the present embodiment can be manufactured at low cost by employing a simple process.

Further, since, as described above, the molding resin is injected into the cavity with the first and second heat dissipation surfaces (defined above) in contact with inner walls of the cavity, the resin is prevented from reaching and adhering to these heat dissipation surfaces during the molding process. This ensures that the first and second heat dissipation surfaces are exposed from the molding resin, even after the resin molding process, thereby improving the heat dissipation characteristics of the resin sealed semiconductor device. It should be noted that according to the present embodiment the collectors of the IGBTs in the upper and lower structures are disposed to face outward from the resin sealed semiconductor device, which is an ideal arrangement for heat dissipation. That is, this allows a heat sink to be disposed on the collector side of each IGBT. As a result, the heat sink can be designed to have a heat dissipation area as large as, or larger than, the projected area of the IGBT.

Further, since in the resin sealed semiconductor device of the present embodiment the upper structure is stacked on the lower structure in the thickness direction of the device, the footprint of the device can be reduced, as compared to when these structures are disposed side by side on a flat surface.

Further, in the resin sealed semiconductor device of the present embodiment, the first collector terminal 20 and the second emitter terminal 26 extend outwardly from the molding resin 34 in a direction opposite the first emitter terminal 22 and the second collector terminal 24. This means that the currents in the upper and lower structures flow in opposite directions, resulting in reduced mutual inductance.

There will now be described a variation of the resin sealed semiconductor device of the present embodiment which is constructed to have improved heat dissipation characteristics.

Figure 8:
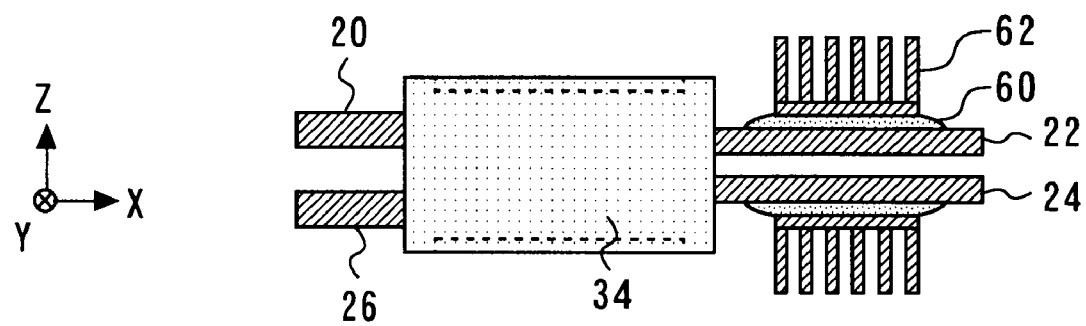
FIG. 8 is a diagram illustrating resin sealed semiconductor device, in which a cooling fin structure is attached to each of the first emitter terminal and the second collector terminal by solder.

FIG. 8 is a diagram illustrating this resin sealed semiconductor device, in which a cooling fin structure 62 is attached to each of the first emitter terminal 22 and the second collector terminal 24 by solder 60. With these cooling fin structures 62, the resin sealed semiconductor device has even better heat dissipation characteristics than the resin sealed semiconductor device of the present embodiment in which the first and second heat sinks 38 and 39 provide good heat dissipation. It should be noted that a cooling structure such as the cooling fin structure 62 may be attached to any one or more of the collector and emitter terminals to enhance the heat dissipation characteristics of the device.

Figure 9:
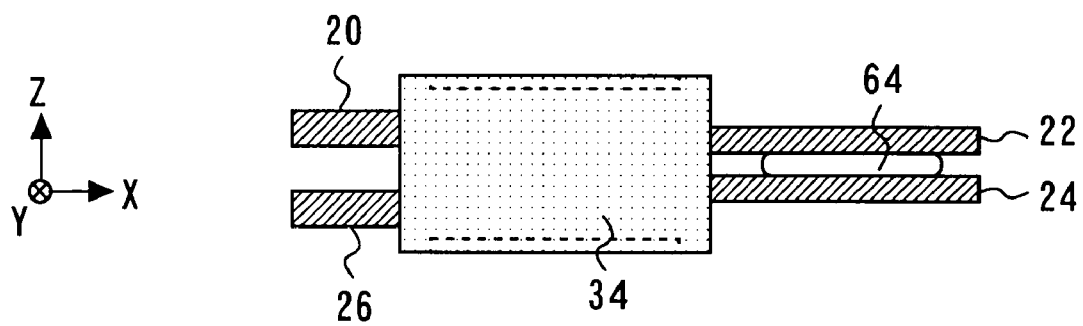
FIG. 9 illustrates a different cooling structure, namely a cooling plate.

FIG. 9 illustrates a different cooling structure, namely a cooling plate 64. This cooling structure may also be attached to any one or more of the collector and emitter terminals.

Although the present embodiment and a variation thereof have been described in connection with resin sealed semiconductor devices containing the first and second IGBTs 10 and 12 and the first and second diodes 14 and 16, it is to be understood that they may be applied to resin sealed semiconductor devices containing any suitable type of semiconductor element. That is, the present embodiment allows a resin sealed semiconductor device including a plurality of stacked semiconductor elements to be manufactured such that these semiconductor elements are integrally sealed together without causing any damage thereto and that the resin sealed semiconductor device has good heat dissipation characteristics (the primary advantage of the present invention).

Various alterations may be made to the resin sealed semiconductor device of the present embodiment without departing from the spirit and scope of the present invention. For example, the first and second heat sinks 38 and 39 may be made of copper foil. Further, the first and second insulating layers 36 and 37 may be omitted, or replaced by other suitable components, depending on the application.

Second Embodiment

Figure 10:
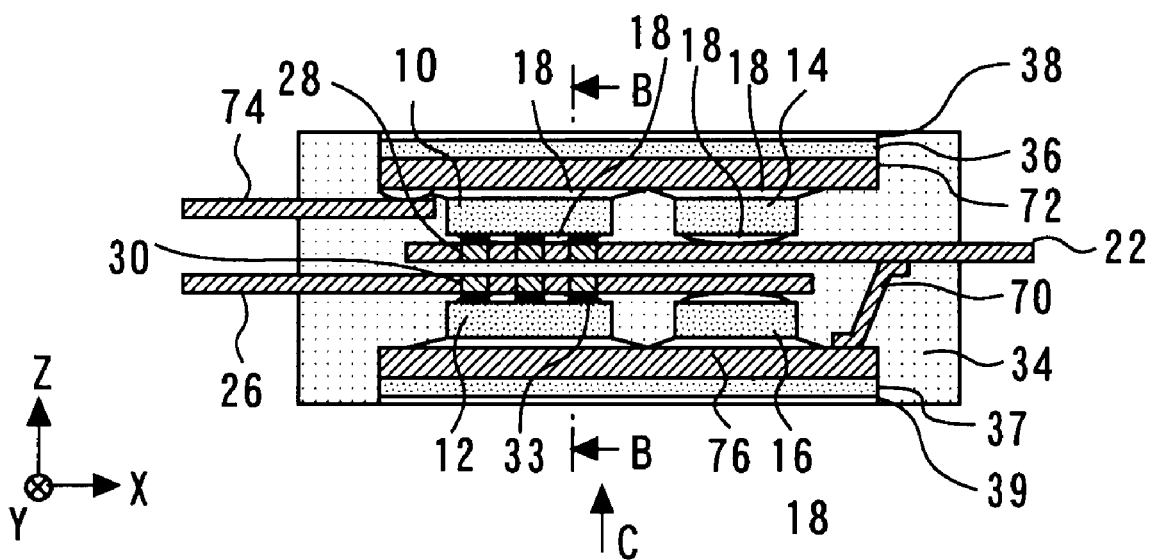
FIG. 10 is a cross-sectional view of resin sealed semiconductor device of second embodiment.

A second embodiment of the present invention relates to a resin sealed semiconductor device having a simplified configuration and yet having improved heat dissipation characteristics and electrical characteristics. FIG. 10 is a cross-sectional view of this resin sealed semiconductor device. In FIG. 10 those components common to FIG. 1 retain the same reference numerals and will not be further described. It should be noted that only so much of this embodiment will be described as necessary for an understanding of its features as compared to those of the first embodiment.

According to the present embodiment, a first heat spreader 72 is bonded, by solder 18, to the bottom surface (the upper surface as viewed in FIG. 10) of the first IGBT 10 and to the surface of the first diode 14 having a cathode formed therein. Further, a second heat spreader 76 is bonded, by solder 18, to the bottom surface (the lower surface as viewed in FIG. 10) of the second IGBT 12 and to the surface of the second diode 16 having a cathode formed therein. The first and second heat spreaders 72 and 76 are metal plates having good electrical conductivity.

The collector terminal, 74, of the first IGBT 10 is connected to the surface of the first heat spreader 72 in contact with the bottom surface of the first IGBT 10, etc. The collector terminal 74 has a portion extending outwardly from the molding resin 34.

A connecting lead 70 is connected to the same surface of the second heat spreader 76 to which the collector of the second IGBT 12 and the cathode of the second diode 16 are bonded. More specifically, the connecting lead 70 is disposed within the molding resin 34 and connected between the heat spreader 76 and the first emitter terminal 22.

The resin sealed semiconductor device of the present embodiment is designed to be used as any one of the U-phase leg, V-phase leg, and W-phase leg of a three-phase AC inverter. Each of these inverter legs requires that the emitter terminal of its upper structure (defined in connection with the first embodiment) be connected to the collector terminal of its lower structure (also defined in connection with the first embodiment). The above connecting lead 70, disposed within the molding resin 34, serves this purpose, thereby simplifying the configuration of the leg, or inverter. The collector terminal 74 and the second emitter terminal 26 are disposed to extend parallel to each other and in the same direction within and outwardly from the molding resin 34. The first emitter terminal 22 is parallel to the collector terminal 74 and the second emitter terminal 26, but a portion thereof extends outwardly from the molding resin 34 in a direction opposite the collector terminal 74 and the second emitter terminal 26. It should be noted that the first emitter terminal 22, the collector terminal 74, and the second emitter terminal 26 may be referred to as the "main electrode output terminal," "main electrode P-terminal," and "main electrode N-terminal," respectively, on account of their functions.

Figure 11:
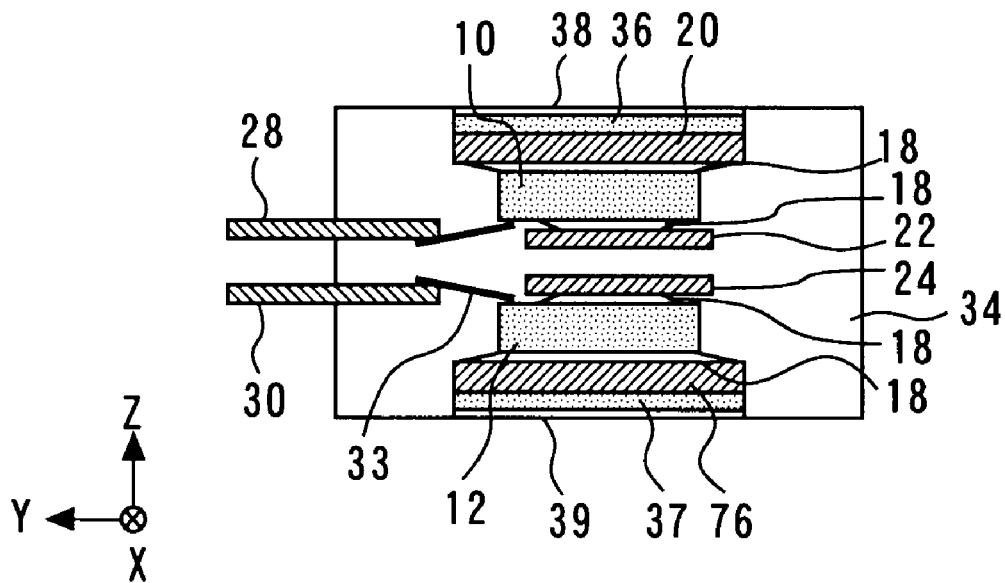
FIG. 11 is a cross-sectional view of the device as viewed in the direction of arrows B in FIG. 10.
Figure 12:
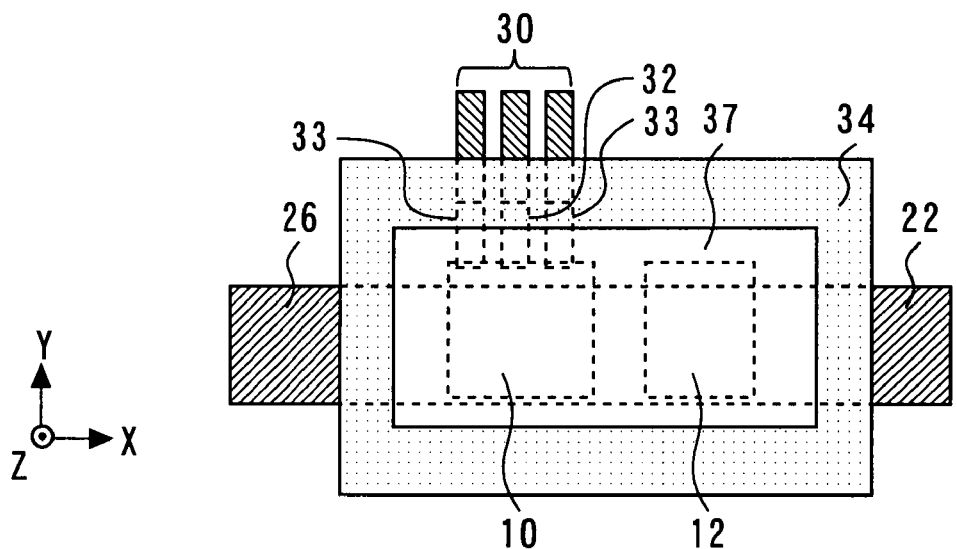
FIG. 12 is a view as viewed in the direction of arrow C in FIG. 10.

FIGS. 11 and 12 show the resin sealed semiconductor device of the present embodiment as viewed from different angles than in FIG. 10. Specifically, FIG. 11 is a cross-sectional view of the device as viewed in the direction of arrows B in FIG. 10, and FIG. 12 is a view as viewed in the direction of arrow C in FIG. 10. This resin sealed semiconductor device is manufactured by a method similar to that of the first embodiment and a description of this method will not be provided herein.

Figure 13:
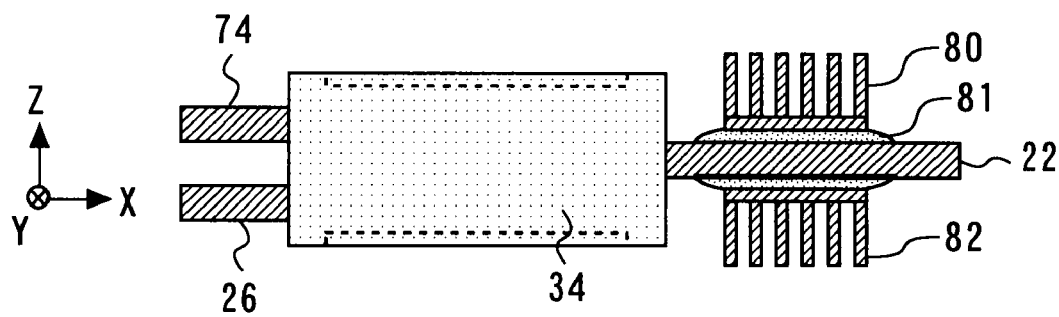
FIG. 13 shows cooling fin structures attached by solder to the top and bottom surfaces, respectively, of the portion of the first emitter terminal outside the molding resin.
Figure 14:
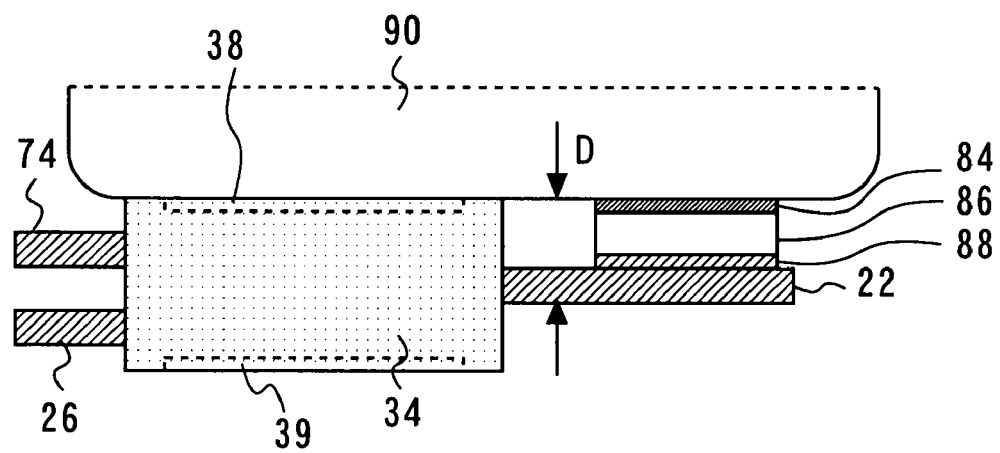
FIG. 14 illustrates a resin sealed semiconductor device in which a cooling plate disposed on and in contact with the first heat sink is adapted to also cool the first emitter terminal.
Figure 15:
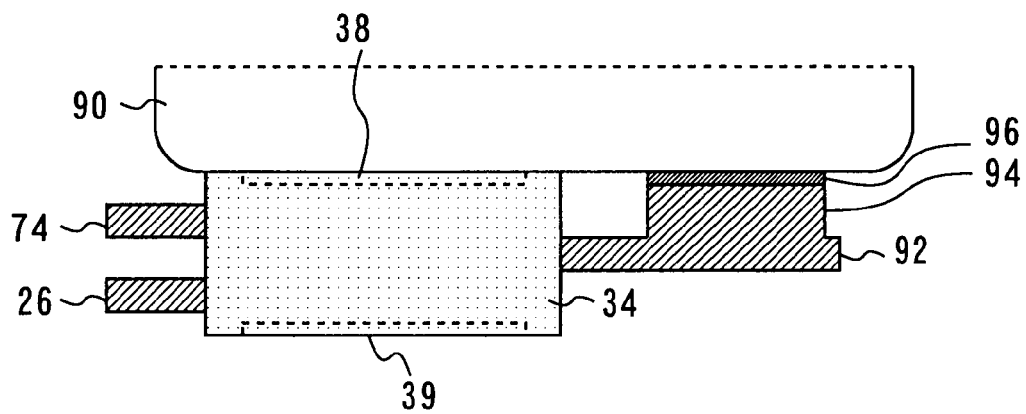
FIG. 15 illustrates another resin sealed semiconductor device in which the cooling plate is used to cool both the first heat sink and the first emitter terminal.

FIGS. 13, 14, and 15 show additional means for improving the heat dissipation characteristics of the resin sealed semiconductor device of the present embodiment. Specifically, FIG. 13 shows cooling fin structures 80 and 82 attached by solder 81 to the top and bottom surfaces, respectively, of the portion of the first emitter terminal 22 outside the molding resin 34. This arrangement improves the heat dissipation characteristics of the first emitter terminal 22.

FIG. 14 illustrates a resin sealed semiconductor device in which a cooling plate 90 disposed on and in contact with the first heat sink 38 is adapted to also cool the first emitter terminal 22. It should be noted that the primary function of the cooling plate 90 is to cool a heat sink (in this example, the first heat sink 38). According to the present embodiment, the cooling plate 90 is thermally connected to the first emitter terminal 22 through a grease layer 84, a high heat dissipation insulator 86, and an insulating layer 88, thus cooling both the first heat sink 38 and the first emitter terminal 22 at the same time. It should be further noted that the insulating layer 88 is provided to electrically isolate the first heat sink 38 from the first emitter terminal 22.

FIG. 15 illustrates another resin sealed semiconductor device in which the cooling plate 90 is used to cool both the first heat sink 38 and the first emitter terminal. This resin sealed semiconductor device differs from that shown in FIG. 14 in that its first emitter terminal 92 has a thick portion located outside the molding resin 34. This thick portion of the first emitter terminal 92 is constructed to be in contact with a high heat dissipation insulating layer 96, as shown in FIG. 15, making it easy to cool the first heat sink 38 and the first emitter terminal 92 in the same manner.

Thus, since the portion of the first emitter terminal 92 extending outwardly from the molding resin 34 includes a thick portion 94, the thermal resistance between the cooling plate 90 and the first emitter terminal 92 is reduced, as compared to the cooling structure shown in FIG. 14. That is, in the case of the cooling structure shown in FIG. 15, the thick portion 94 of the first emitter terminal 92 has considerable heat capacity, resulting in improved heat transfer characteristics. (There is little thermal resistance between the thick portion 94 and the other portion of the first emitter terminal 92.)

This completes the description of the heat dissipation characteristics of the resin sealed semiconductor device of the present embodiment. The following description will be directed to its electrical characteristics.

Figure 16:
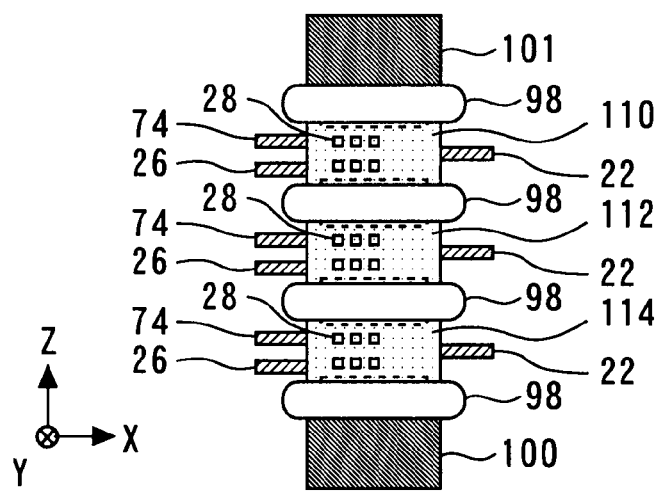
FIG. 16 shows a three-phase AC inverter including resin sealed semiconductor devices that constitute the U-phase, V-phase, and W-phase legs, respectively.

The electrical characteristics of the resin sealed semiconductor device of the present embodiment will be described with reference to FIGS. 16, 17, 18, and 19. FIG. 16 shows a three-phase AC inverter including resin sealed semiconductor devices 110, 112, and 114 that constitute the U-phase, V-phase, and W-phase legs, respectively. Each of these inverter legs is sandwiched between a pair of cooling plates 98. The U-phase resin sealed semiconductor device 110, the V-phase resin sealed semiconductor device 112, and the W-phase resin sealed semiconductor device 114 each correspond to the resin sealed semiconductor device shown in FIG. 10. The same terminal of each resin sealed semiconductor device 110, 112, 114 extends in the same direction outwardly from the molding resin. Specifically, the collector terminals 74 and the second emitter terminals 26 of the U-phase, V-phase, and W-phase resin sealed semiconductor devices 110, 112, and 114 extend in one direction, and the first emitter terminals 22 of these resin sealed semiconductor devices extend in the opposite direction.

Reactances 100 and 101 are fixed to the respective outermost cooling plates 98 by screws, etc., so that the assembly made up of the three modules, or resin sealed semiconductor devices, and the cooling plates 98 is sandwiched between the reactances 100 and 101 (each module being sandwiched between a pair of cooling plates 98).

Figure 17:
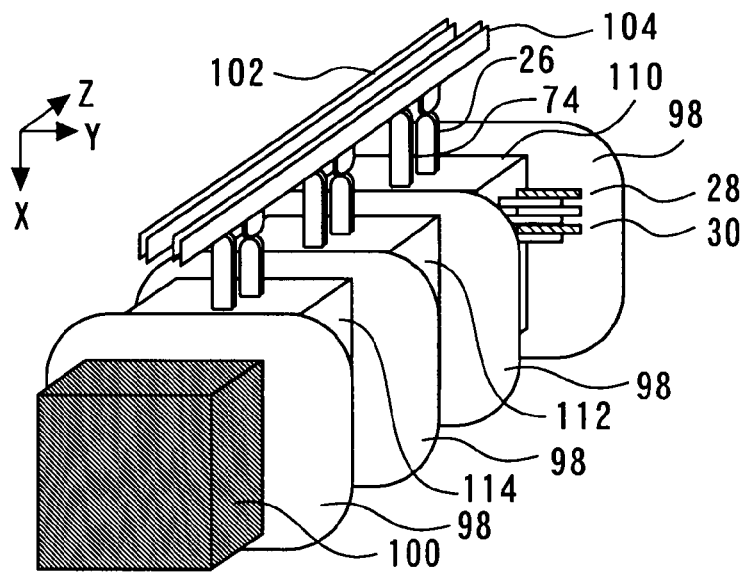
FIG. 17 is a perspective view showing the assembly of FIG. 16 with an N-bus bar and a P-bus bar connected thereto.

The three-phase AC inverter configured as described above is connected to bus bars, as described below with reference to FIG. 17. FIG. 17 is a perspective view showing the assembly of FIG. 16 with an N-bus bar 102 and a P-bus bar 104 connected thereto. Specifically, the N-bus bar 102 is connected to the collector terminals 74 of the three modules, and the P-bus bar 104 is connected to their second emitter terminals 26. It should be noted that the N-bus bar 102 and the P-bus bar 104 are disposed parallel to each other.

Since the three-phase AC inverter has the electrode arrangement described above, it is possible to reduce the area within the current path loop formed via the P-bus bar 104, each resin sealed semiconductor device (or inverter module), and the N-bus bar 102 and thereby reduce the inductance of the inverter.

Incidentally, each semiconductor device such as a resin sealed semiconductor device must be designed to withstand a predetermined maximum voltage, which determines the required minimum insulation distance, or creepage distance, for the device. That is, in the case of the resin sealed semiconductor device of the present embodiment, at least the minimum creepage distance must be established between the P- and N-electrodes and the output terminals (emitter and collector terminals) to withstand the predetermined maximum voltage.

Figure 18:
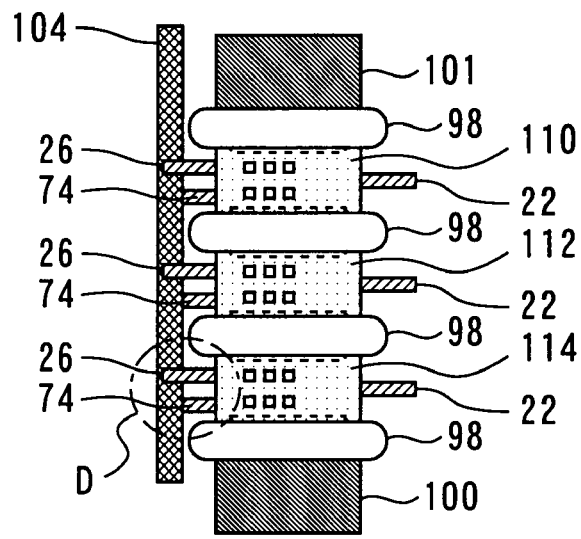
FIG. 18 is a side view of the view of FIG. 17.
Figure 19:
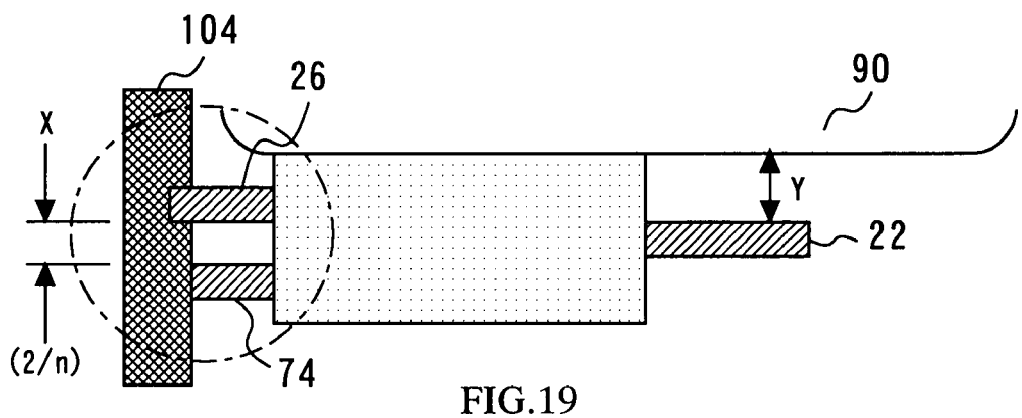
FIG. 19 is an enlarged view of the portion encircled by the dashed line in FIG. 18, and of adjacent portions.
Figure 20:
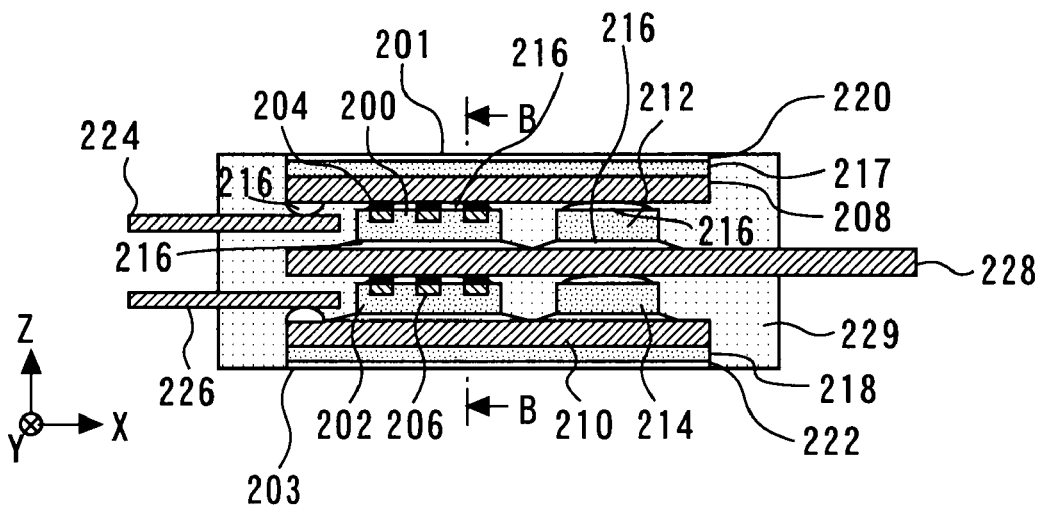
FIG. 20 is a cross-sectional view of the resin sealed semiconductor device according to the third embodiment.

According to the present embodiment, the distance between the collector terminal 74 and the second emitter terminal 26 is greater than the required minimum creepage distance (denoted by d). Further, the distance between the cooling plate 90 and the first emitter terminal 22 is also greater than the required creepage distance d, ensuring that the device withstands the required maximum voltage. FIG. 18 is a side view of the view of FIG. 17. Further, FIG. 19 is an enlarged view of the portion encircled by the dashed line in FIG. 18, and of adjacent portions. Referring to FIG. 19, the distances X and Y are greater than the required minimum creepage distance d.

Although the present embodiment has been described as improving the heat dissipation characteristics and electrical characteristics of the resin sealed semiconductor device shown in FIG. 10, it is to be understood that the embodiment may be applied to any suitable type of resin sealed semiconductor device. That is, the present embodiment may be used to improve the heat dissipation characteristics and electrical characteristics of any resin sealed semiconductor device in which the first emitter terminal 22 faces and is spaced from the second emitter terminal 26 by a gap, as in the first embodiment.

Third Embodiment

A third embodiment of the present invention relates to a resin sealed semiconductor device in which the upper and lower structures are stacked one on the other without any gap and integrally sealed using a resin, and also relates to a method for manufacturing such a resin sealed semiconductor device. The present embodiment will be described with reference to FIGS. 20, 21, 22, and 23. The resin sealed semiconductor device of the present embodiment includes a first IGBT 200 and a second IGBT 202 each having a gate and an emitter formed in its top surface and a collector formed in its bottom surface. The resin sealed semiconductor device also includes a first diode 212 and a second diode 214 each having a cathode formed in its top surface and an anode formed in its bottom surface.

The emitter of the first IGBT 200 and the anode of the first diode 212 are connected to a plate-like first heat spreader 208 by solder 216, etc. A first emitter terminal 224 partially extending outwardly from the molding resin, 229, is also connected to the first heat spreader 208. A first high heat dissipation insulator 217 of an organic composition is disposed on the surface of the first heat spreader 208 opposite that to which the first IGBT 200, etc. are connected. The first high heat dissipation insulator 217 is made of a material having a glass transition temperature lower than the mold die temperature. In general the mold die temperature is approximately 180° C., although the present invention is not limited to this specific temperature.

A first heat sink 201 is bonded to the surface of the first high heat dissipation insulator 217 opposite that in contact with the first heat spreader 208. The surface of the first heat sink 201 opposite that in contact with the first high heat dissipation insulator 217 is exposed from the molding resin 229.

The resin sealed semiconductor device of the present embodiment further includes a plate-like output terminal 228. The output terminal 228 is bonded at one surface thereof to the collector of the first IGBT 200 and the cathode of the first diode by solder 216, etc., and bonded at the opposite surface thereof to the emitter of the second IGBT and the anode of the second diode 214. The output terminal 228 partially extends outwardly from the molding resin 229 in a direction opposite the first emitter terminal.

Further, the collector of the second IGBT 202 and the cathode of the second diode 214 are connected to a plate-like second heat spreader 210 by solder 216, etc. A second collector terminal 226 partially extending outwardly from the molding resin 229 is also connected to the second heat spreader 210. It should be noted that the second collector terminal 226 and the first emitter terminal 224 extend parallel to each other and in the same direction within and outwardly from the molding resin 229.

Figure 21:
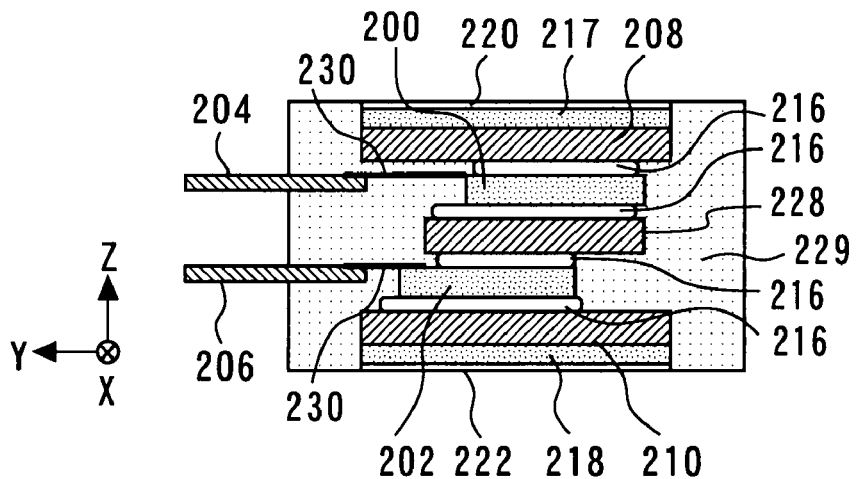
FIG. 21 is a cross-sectional view of the resin sealed semiconductor device as viewed in the direction of arrows B in FIG. 20.

A second high heat dissipation insulator 218 is disposed on the surface of the second heat spreader 210 opposite that to which the collector of the second IGBT 202, etc. are connected. The second high heat dissipation insulator 218 has the same composition as the first heat dissipation insulator 217. Specifically, for example, the first and second high heat dissipation insulators 217 and 218 are made of an epoxy resin and have a thickness of approximately 0.2-0.3 mm. They can expand or contract approximately 10% in thickness at their glass transition temperature. A second heat sink 203 is bonded to the surface of the second high heat dissipation insulator 218 opposite that in contact with the second heat spreader 210. The surface of the second heat sink 203 opposite that in contact with the second high heat dissipation insulator 218 is exposed from the molding resin 229. It should be noted that FIG. 21 is a cross-sectional view of the resin sealed semiconductor device as viewed in the direction of arrows B in FIG. 20 and illustrates the control terminals of the first and second IGBTs 200 and 202. These control terminals are the same as those described in connection with the first embodiment and will not be described herein.

In the resin sealed semiconductor device of the present embodiment, no gap is provided between the upper and lower structures, unlike in the first embodiment. However, when the upper and lower structures are placed within the cavity in the molding die and the temperature of the die is increased to the mold die temperature (at which the molding resin softens), the temperature of the first and second high heat dissipation insulators 217 and 218 increases and reaches their glass transition temperature. That is, during the resin sealing process, these high heat dissipation insulators expand or contract to accommodate the difference, if any, between the cavity depth and the normal thickness of the semiconductor device assembly (i.e., the thickness of the assembly at lower than the glass transition temperature of the high heat dissipation insulators), the assembly being made up of the upper and lower structures and the output terminal 228. This will be described in more detail with reference to FIGS. 22 and 23.

Figure 22:
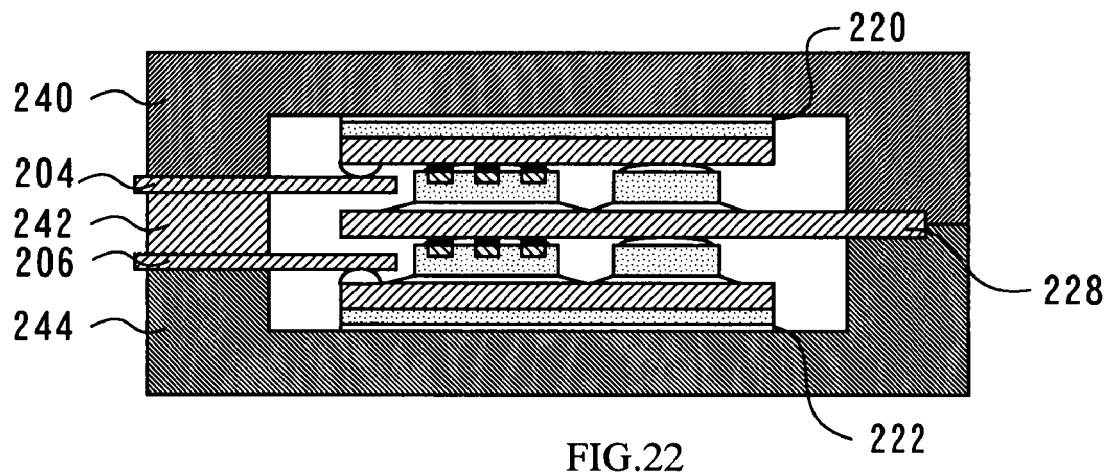
FIG. 22 is a diagram illustrating the upper and lower structures placed within the cavity of the molding die when the sum of the thicknesses of these structures and the output terminal is smaller than the cavity depth.

FIG. 22 is a diagram illustrating the upper and lower structures placed within the cavity of the molding die when the sum of the thicknesses of these structures and the output terminal 228 is smaller than the cavity depth. In this case, if it were not for the first and second high heat dissipation insulators 217 and 218 (a conventional arrangement), the first and second heat dissipation surfaces might be covered by the molding resin as a result of the resin sealing process. (It should be noted that the first and second heat dissipation surfaces are the surfaces of the first and second heat sinks 201 and 203 opposite those in contact with the first and second high heat dissipation insulators 217 and 218, respectively, and should be exposed from the molding resin, even after the resin sealing process.) According to the present embodiment, the first and second high heat dissipation insulators 217 and 218 thermally expand at their glass transition temperature if an external compressive force is not applied thereto, thereby accommodating the difference between the cavity depth and the sum of the normal thicknesses of the upper and lower structures and the output terminal 228. That is, according to the present embodiment, the sum of the thicknesses of the upper and lower structures and the output terminal 228 is equal to the cavity depth when these structures are integrally sealed using a molding resin. This allows the heat sinks to be exposed from the molding resin while preventing damage to the components, as in the first embodiment.

Figure 23:
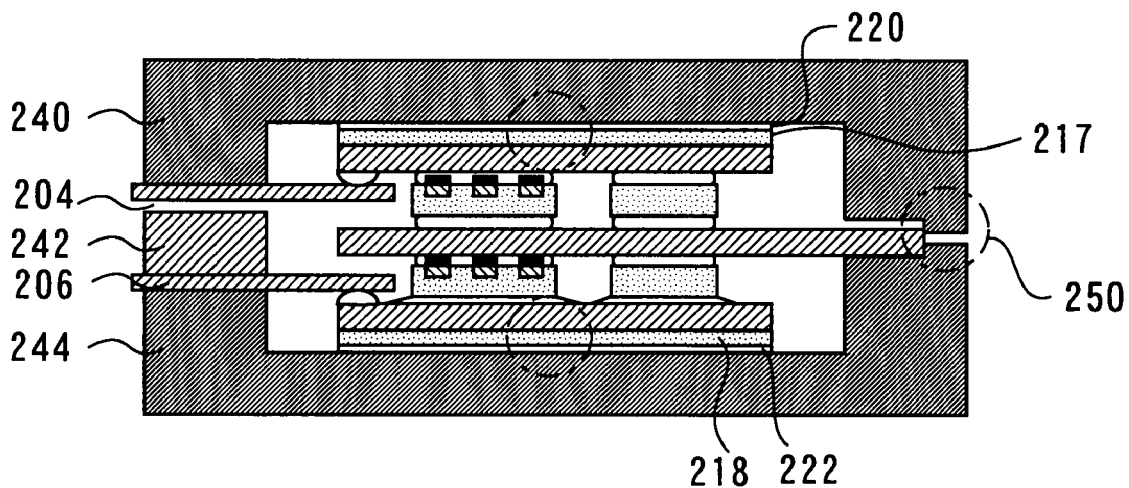
FIG. 23 is a diagram illustrating the upper and lower structures placed within the cavity of the die when the sum of the thicknesses of these structures and the output terminal is larger than the cavity depth.

FIG. 23 is a diagram illustrating the upper and lower structures placed within the cavity of the die when the sum of the thicknesses of these structures and the output terminal 228 is larger than the cavity depth. In this case, a compressive force may be applied to the upper and lower structures when the lower, intermediate, and upper dies are clamped together. However, the first and second high heat dissipation insulators 217 and 218 soften at their glass transition temperature and contract upon receiving such a force, thereby accommodating the difference between the cavity depth and the sum of the normal thicknesses of the upper and lower structures and the output terminal 228. That is, the sum of the thicknesses of the upper and lower structures and the output terminal 228 is equal to the cavity depth when these structures are integrally sealed using a molding resin. This prevents damage to the components such as IGBTs during the resin molding process, as in the first embodiment.

To sum up, the present embodiment allows the upper and lower structures to be integrally sealed using a molding resin without any problem if the variation in the sum of the (normal) thicknesses of these structures is within the range which can be accommodated by the expansion or contraction of the first and second high heat dissipation insulators 217 and 218 at their glass transition temperature or higher. Therefore, the thicknesses, material, etc. of the first and second high heat dissipation insulators 217 and 218 may be determined based on the variation in the (normal) thickness of the semiconductor device assembly made up of the upper and lower structures and the output terminal 228. In this way it is possible to achieve the advantage described in connection with the first embodiment without unnecessarily increasing the thickness of the resin sealed semiconductor device.

Thus, the thicknesses of the first and second high heat dissipation insulators 217 and 218 are not limited to any particular values, since they are determined in response to the variation in the thickness of the IGBT devices, etc. That is, the amounts of expansion and contraction in the thicknesses of these high heat dissipation insulators at their glass transition temperature are also not limited to any particular amounts.

Fourth Embodiment

Figure 24:
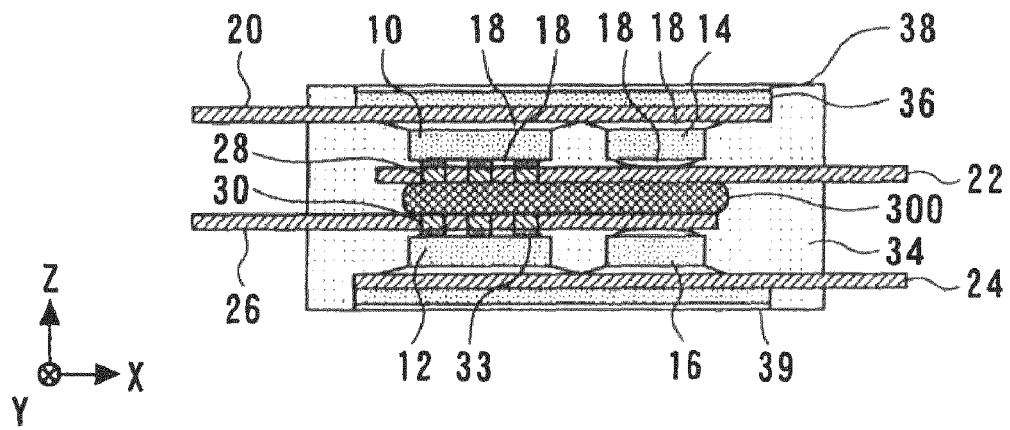
FIG. 24 is a cross-sectional view of the resin sealed semiconductor device according to the fourth embodiment.

A fourth embodiment of the present invention relates to a resin sealed semiconductor device in which an elastic structure is disposed between the upper and lower structures, and also relates to a method for manufacturing such a resin sealed semiconductor device. The present embodiment will be described with reference to FIG. 24. In FIG. 24 those components common to FIG. 1 retain the same reference numerals and will not be further described. The resin sealed semiconductor device of the present embodiment is characterized in that it includes an elastic structure 300 disposed between the first emitter terminal 22 and the second emitter terminal 26.

The elastic structure 300 is a plate-like insulator and has elasticity at least in its thickness direction. This elastic structure 300 is sandwiched between the first IGBT 10 and the second IGBT 12 and between the first diode 14 and the second diode 16.

In the manufacture of this resin sealed semiconductor device, the semiconductor device assembly made up of the upper and lower structures with the elastic structure 300 there between is placed within the cavity of the die, for example. The maximum amounts of expansion and contraction in the thickness of the elastic structure 300 are determined so as to accommodate the variation in the sum of the thicknesses of the upper and lower structures.

With this arrangement, when the semiconductor device assembly is placed in position within the die cavity and the upper and lower dies are clamped together, the elastic structure 300 distorts (expands or contracts) to accommodate the variation, if any, in the thicknesses of the upper and lower structures so that the thickness of the assembly is equal to the cavity depth. This ensures that the first and second heat dissipation surfaces (defined above in connection with the first embodiment) are in contact with inner walls of the upper and lower dies, respectively.

It should be noted that also in the first embodiment described above the first and second heat dissipation surfaces are brought into contact with inner walls of the upper and lower dies, respectively, when the upper and lower structures are placed in position within the die cavity and the upper and lower dies are clamped together. In the case of the first embodiment, however, this results from the fact that the first collector terminal 20 and the first emitter terminal 22 are sandwiched and clamped between lower surfaces of the upper die and the upper surfaces of the intermediate die such that the upper structure is pressed upward, and also from the fact that the second collector terminal 24 and the second emitter terminal 26 are sandwiched and clamped between the lower surfaces of the intermediate die and upper surfaces of the lower die such that the lower structure is pressed downward (see FIG. 7). In the present embodiment, on the other hand, the upper and lower structures are pressed upward and downward, respectively, by the elastic structure 300.

In the first embodiment, the first emitter terminal 22 is separated from the second emitter terminal 26, and the first control terminal 28 is separated from the second control terminal 30, by a gap filled with the molding resin 34. In the present embodiment, on the other hand, these separations are accomplished by means of the elastic structure 300, thereby preventing short-circuit between these terminals more reliably. Thus, the elastic structure 300 of the present embodiment allows the first and second heat dissipation surfaces to be brought into close contact with internal walls of the dies during the resin sealing process while preventing short-circuit between the terminals in the resin sealed semiconductor device.

While the present invention has been described with reference to resin sealed semiconductor devices and manufacturing methods therefor of the first to fourth embodiments, it is to be understood that the invention is not limited to these embodiments and various alterations may be made thereto without departing from the spirit and scope of the invention. That is, a most important concept of the present invention is that in the manufacture of a resin sealed semiconductor device, the semiconductor device assembly can be sealed with a molding resin such that the device has good heat dissipation characteristics, without causing damage to the components, by employing one of the following methods: (1) disposing high heat dissipation insulators over and under the elements, these insulators having a glass transition temperature lower than the mold die temperature; (2) providing a gap between the upper and lower structures; and (3) providing an elastic structure between the upper and lower structures. Therefore, any alteration may be made that does not depart from this concept.

For example, although in the description of the first embodiment the first collector terminal 20 is described as being connected to the first heat sink 38 through the first insulating layer 36, it is to be understood that the first collector terminal 20 may be directly (instead of indirectly) connected to the first heat sink 38. That is, the first collector terminal 20 only needs to be thermally connected to the first heat sink 38. Likewise, the second collector terminal 24 only needs to be thermally connected to the second heat sink 39. This concept also applies to the second to fourth embodiments.

Thus, the present invention can reduce the size and improve the heat dissipation characteristics of a resin sealed semiconductor device without causing any problem.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2008-148040, filed on Jun. 5, 2008 including specification, claims, drawings and summary, on which the Convention priority of the present application is based, are incorporated herein by reference in its entirety.

What is claimed is:

1. A resin sealed semiconductor device comprising:
   a first semiconductor switching device having an emitter in a top surface thereof and a collector in a bottom surface thereof;
   a first emitter terminal bonded to said emitter of said first semiconductor switching device;
   a first collector terminal bonded at a first surface thereof to said collector of said first semiconductor switching device;
   a second semiconductor switching device having an emitter in a top surface thereof and a collector in a bottom surface thereof;
   a second emitter terminal bonded to said emitter of said second semiconductor switching device;
   a second collector terminal bonded at a first surface thereof to said collector of said second semiconductor switching device;
   a first heat sink directly or indirectly bonded at a first surface thereof to a second surface of said first collector terminal, said second surface of said first collector terminal being opposite said first surface of said first collector terminal;
   a second heat sink directly or indirectly bonded at a first surface thereof to a second surface of said second collector terminal, said second surface of said second collector terminal being opposite said first surface of said second collector terminal; and
   a molding resin integrally covering said first and second semiconductor switching devices;
   wherein a second surface of said first heat sink is exposed from said molding resin, said second surface of said first heat sink being opposite said first surface of said first heat sink;
   wherein a second surface of said second heat sink is exposed from said molding resin, said second surface of said second heat sink being opposite said first surface of said second heat sink;
   wherein said emitter of said first semiconductor switching device faces said emitter of said second semiconductor switching device; and
   wherein said first emitter terminal is spaced apart from said second emitter terminal.

2. The resin sealed semiconductor device as claimed in claim 1, wherein said first and second emitter terminals and said first and second collector terminals are of plate-like shape and are disposed parallel to one another such that said first emitter terminal and said second collector terminal partially extend outwardly from said molding resin in a first direction and said first collector terminal and said second emitter terminal partially extend outwardly from said molding resin in a second direction different from said first direction.

3. The resin sealed semiconductor device as claimed in claim 2, further comprising:
   a first bus bar disposed outside said molding resin and connected to said first collector terminal; and
   a second bus bar disposed parallel to said first bus bar and outside said molding resin and connected to said second emitter terminal.

4. The resin sealed semiconductor device as claimed in claim 1, wherein:
   said first and second semiconductor switching devices are IGBTs; and
   said resin sealed semiconductor device further comprises:
   a first diode covered with said molding resin and having a cathode and an anode connected to said first collector terminal and said first emitter terminal, respectively; and
   a second diode covered with said molding resin and having a cathode and an anode connected to said second collector terminal and said second emitter terminal, respectively.

5. The resin sealed semiconductor device as claimed in claim 2, wherein a cooling structure is formed on a portion of at least one of said first and second emitter terminals and said first and second collector terminals to dissipate heat from the inside of said molding resin, said portion extending outwardly from said molding resin.

6. The resin sealed semiconductor device as claimed in claim 1, further comprising:

a connecting lead disposed within said molding resin and connected between said first emitter terminal and said second collector terminal.

7. The resin sealed semiconductor device as claimed in claim 1, further comprising:
an elastic structure disposed between said first emitter terminal and said second emitter terminal.

8. A resin sealed semiconductor device comprising:
a first semiconductor switching device having an emitter in a top surface thereof and a collector in a bottom surface thereof;
a second semiconductor switching device having an emitter in a top surface thereof and a collector in a bottom surface thereof;
a main electrode output terminal sandwiched between said top surface of said first semiconductor switching device and said bottom surface of said second semiconductor switching device;
a first collector terminal bonded at a first surface thereof to said collector of said first semiconductor switching device;
a second emitter terminal bonded at a first surface thereof to said emitter of said second semiconductor switching device;
a first high heat dissipation insulator of an organic composition directly or indirectly bonded at a first surface thereof to a second surface of said first collector terminal, said second surface of said first collector terminal being opposite said first surface of said first collector terminal;
a second high heat dissipation insulator of an organic composition directly or indirectly bonded at a first surface thereof to a second surface of said second emitter terminal, said second surface of said second emitter terminal being opposite said first surface of said second emitter terminal;
a first heat sink bonded at a first surface thereof to a second surface of said first high heat dissipation insulator, said second surface of said first high heat dissipation insulator being opposite said first surface of said first high heat dissipation insulator;
a second heat sink bonded at a first surface thereof to a second surface of said second high heat dissipation insulator, said second surface of said second high heat dissipation insulator being opposite said first surface of said second high heat dissipation insulator; and
a molding resin integrally covering said first and second semiconductor switching devices;
wherein a second surface of said first heat sink is exposed from said molding resin, said second surface of said first heat sink being opposite said first surface of said first heat sink;
wherein a second surface of said second heat sink is exposed from said molding resin, said second surface of said second heat sink being opposite said first surface of said second heat sink; and
wherein said first and second high heat dissipation insulators have a glass transition temperature lower than the temperature at which said molding resin softens.

9. A method for manufacturing a resin sealed semiconductor device, comprising the steps of:
bonding a first emitter terminal to an emitter formed in a top surface of a first semiconductor switching device;
bonding a first surface of a first collector terminal to a collector formed in a bottom surface of said first semiconductor switching device;
directly or indirectly bonding a first surface of a first heat sink to a second surface of said first collector terminal, said second surface of said first collector terminal being opposite said first surface of said first collector terminal;
bonding a second emitter terminal to an emitter formed in a top surface of a second semiconductor switching device;
bonding a first surface of a second collector terminal to a collector formed in a bottom surface of said second semiconductor switching device;
directly or indirectly bonding a first surface of a second heat sink to a second surface of said second collector terminal, said second surface of said second collector terminal being opposite said first surface of said second collector terminal;
placing said first and second semiconductor switching devices, said first and second emitter terminals, said first and second collector terminals, and said first and second heat sinks together in position within a cavity formed by an upper die and a lower die; and
injecting a molding resin into said cavity to integrally cover said first and second semiconductor switching devices;
wherein said placing step and said injecting step are performed such that:
a second surface of said first heat sink is in contact with an inner bottom surface of said lower die, said second surface of said first heat sink being opposite said first surface of said first heat sink;
a second surface of said second heat sink is in contact with an inner top surface of said upper die, said second surface of said second heat sink being opposite said first surface of said second heat sink;
said emitter of said first semiconductor switching device faces said emitter of said second semiconductor switching device; and
said first emitter terminal is spaced apart from said second emitter terminal.

10. The method as claimed in claim 9, wherein said placing step includes disposing an elastic structure between said first emitter terminal and said second emitter terminal.

11. The method as claimed in claim 9, wherein:
said first emitter terminal extends from said first semiconductor switching device in a first direction;
said first collector terminal extends from said first semiconductor switching device in a second direction different from said first direction;
said second emitter terminal extends from said second semiconductor switching device in said second direction;
said second collector terminal extends from said second semiconductor switching device in said first direction; and
said placing step includes the steps of:
placing said first emitter terminal and said first collector terminal on an upper surface of said lower die;
placing an intermediate die on said first emitter terminal and said first collector terminal;
placing said second emitter terminal and said second collector terminal on said intermediate die; and
placing said upper die on said second emitter terminal and said second collector terminal such that a lower surface of said upper die is pressed against a top surface of said second emitter terminal and a top surface of said second collector terminal.

12. A method for manufacturing a resin sealed semiconductor device, comprising the steps of:

bonding a first surface of a first collector terminal to a collector of a first semiconductor switching device, said first semiconductor switching device having an emitter in a top surface thereof and said collector in a bottom surface thereof;

directly or indirectly bonding a first surface of a first high heat dissipation insulator of an organic composition to a second surface of said first collector terminal, said second surface of said first collector terminal being opposite said first surface of said first collector terminal;

bonding a first surface of a first heat sink to a second surface of said first high heat dissipation insulator, said second surface of said first high heat dissipation insulator being opposite said first surface of said first high heat dissipation insulator;

bonding a first surface of a second emitter terminal to an emitter of a second semiconductor switching device, said second semiconductor switching device having said emitter in a top surface thereof and a collector in a bottom surface thereof;

directly or indirectly bonding a first surface of a second high heat dissipation insulator of an organic composition to a second surface of said second emitter terminal, said second surface of said second emitter terminal being opposite said first surface of said second emitter terminal;

bonding a first surface of a second heat sink to a second surface of said second high heat dissipation insulator, said second surface of said second high heat dissipation insulator being opposite said first surface of said second high heat dissipation insulator;

bonding and sandwiching a main electrode output terminal between said top surface of said first semiconductor switching device and said bottom surface of said second semiconductor switching device;

placing said first and second semiconductor switching devices, said first collector terminal, said second emitter terminal, said first and second high heat dissipation insulators, said first and second heat sinks, and said main electrode output terminal together in position within a cavity formed by an upper die and a lower die; and injecting a molding resin into said cavity to integrally cover said first and second semiconductor switching devices;

wherein said first and second high heat dissipation insulators have a glass transition temperature lower than the temperature at which said molding resin softens; and wherein said placing step and said injecting step are performed such that:

a second surface of said first heat sink is in contact with an inner bottom surface of said lower die, said second surface of said first heat sink being opposite said first surface of said first heat sink; and a second surface of said second heat sink is in contact with an inner top surface of said upper die, said second surface of said second heat sink being opposite said first surface of said second heat sink.

* * * * *